(12) United States Patent
Otani et al.

(10) Patent No.: US 7,006,357 B2
(45) Date of Patent: Feb. 28, 2006

(54) SHIELDING CASE FOR ELECTRONIC DEVICES

(75) Inventors: Koji Otani, Atsugi (JP); Yutaka Tanaka, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 272 days.

(21) Appl. No.: 10/336,093

(22) Filed: Jan. 3, 2003

(65) Prior Publication Data

US 2003/0128535 A1    Jul. 10, 2003

(30) Foreign Application Priority Data

Jan. 8, 2002    (JP)    ............................. 2002-001192
Jan. 8, 2002    (JP)    ............................. 2002-001193
Jan. 8, 2002    (JP)    ............................. 2002-001195
Jan. 8, 2002    (JP)    ............................. 2002-001196

(51) Int. Cl.
    *H05K 5/00*    (2006.01)
    *H05K 5/04*    (2006.01)
    *H05K 5/06*    (2006.01)

(52) U.S. Cl. ....................... 361/752; 361/800; 361/797

(58) Field of Classification Search ................ 361/752, 361/797, 800, 816, 818, 685; 439/61, 668, 439/76.2, 76.1; 174/35 R, 51, 35 MS
See application file for complete search history.

(56) References Cited

U.S. PATENT DOCUMENTS 6,159,022 A * 12/2000 Tsai ........................... 439/76.1
6,313,400 B1 * 11/2001 Mosquera et al. ........ 174/35 R
2003/0223200 A1 * 12/2003 Simmons et al. ........... 361/737

FOREIGN PATENT DOCUMENTS

| JP | 63-133600 | 6/1988 |
| JP | 1-107194 | 7/1989 |
| JP | 1-160876 | 11/1989 |
| JP | 02 113392 | 9/1990 |
| JP | 3-104978 | 10/1991 |
| JP | 4-33670 | 8/1992 |
| JP | 5-20371 | 3/1993 |
| JP | 05 33489 | 4/1993 |
| JP | 10256750 | 9/1998 |
| JP | 10 289769 | 10/1998 |
| JP | 10 335881 | 12/1998 |
| JP | 10326647 | 12/1998 |
| JP | 2002-208222 | 7/2000 |
| JP | 2001-284876 | 10/2001 |

* cited by examiner

*Primary Examiner*—Randy W. Gibson
*Assistant Examiner*—Hung S. Bui
(74) *Attorney, Agent, or Firm*—Ladas & Parry LLP

(57) ABSTRACT

A shielding case for an electronic apparatus is provided. The shielding case houses a printed circuit board on which an electronic component and an output connector are mounted. The shielding case defines a recessed portion by its case wall. The recessed portion is provided with an opening located in a lateral direction from the mounting position of the output connector. The recessed portion is provided with an opening located in an upward direction from the mounting position of the output connector. The shielding case allows insertion of a cable either from above or sideways relative to the connector. Further, an aperture is provided in the case wall. The aperture is at a position that faces a side surface of the output connector when the connector is in the mounting position. It becomes possible to selectively employ one of a horizontal-insertion type output connector and a vertical-insertion type output connector.

9 Claims, 19 Drawing Sheets

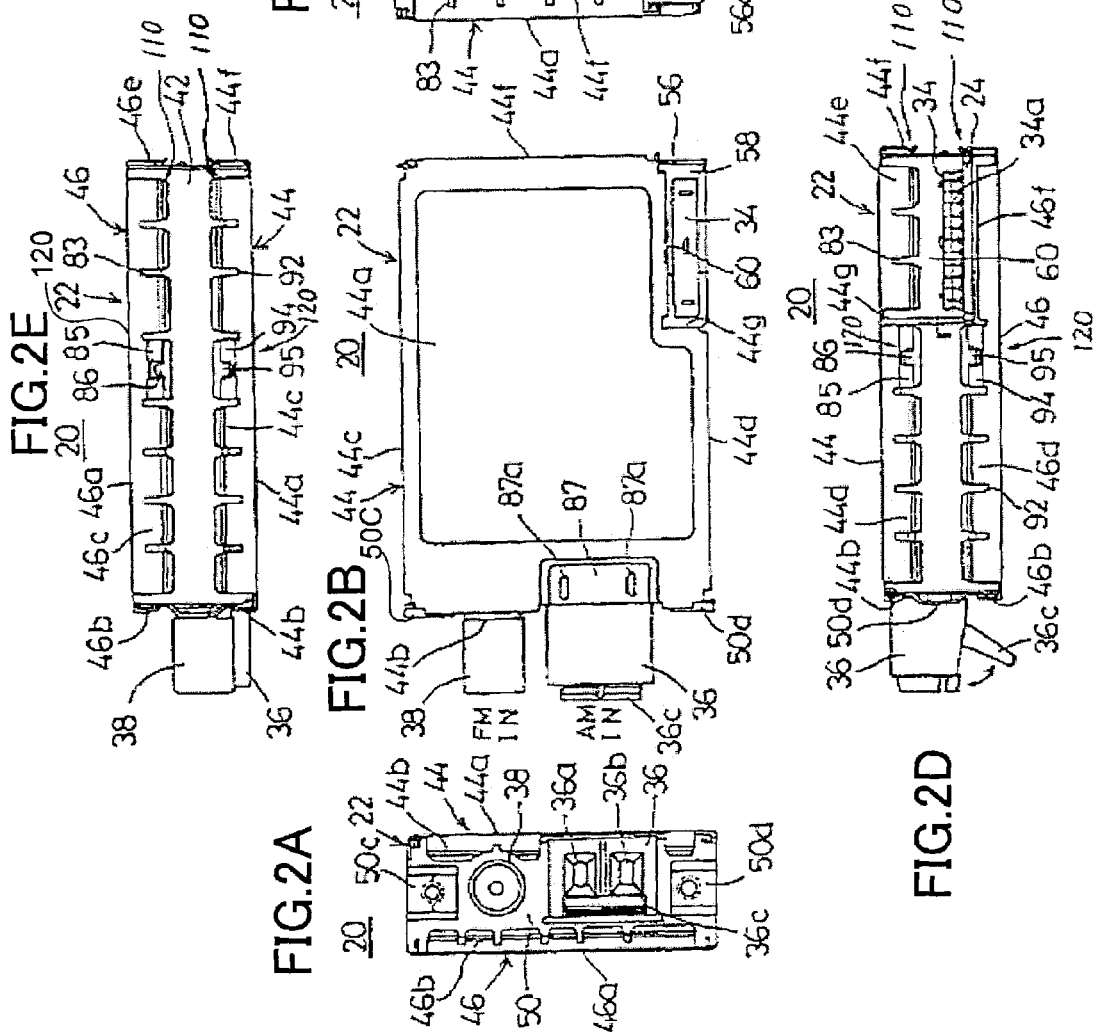

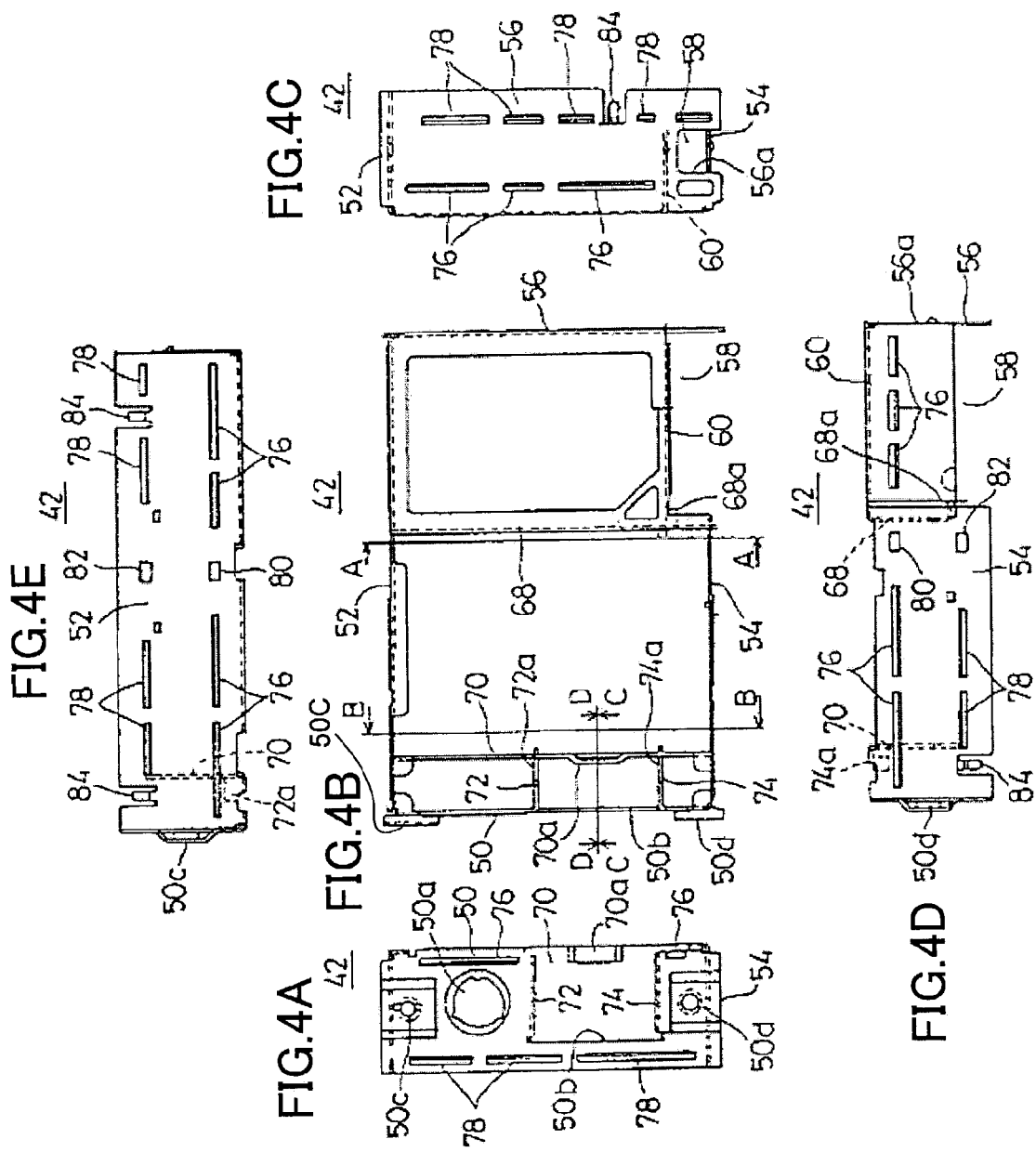

A-A

B-B

C-C

D-D

E-E

F-F

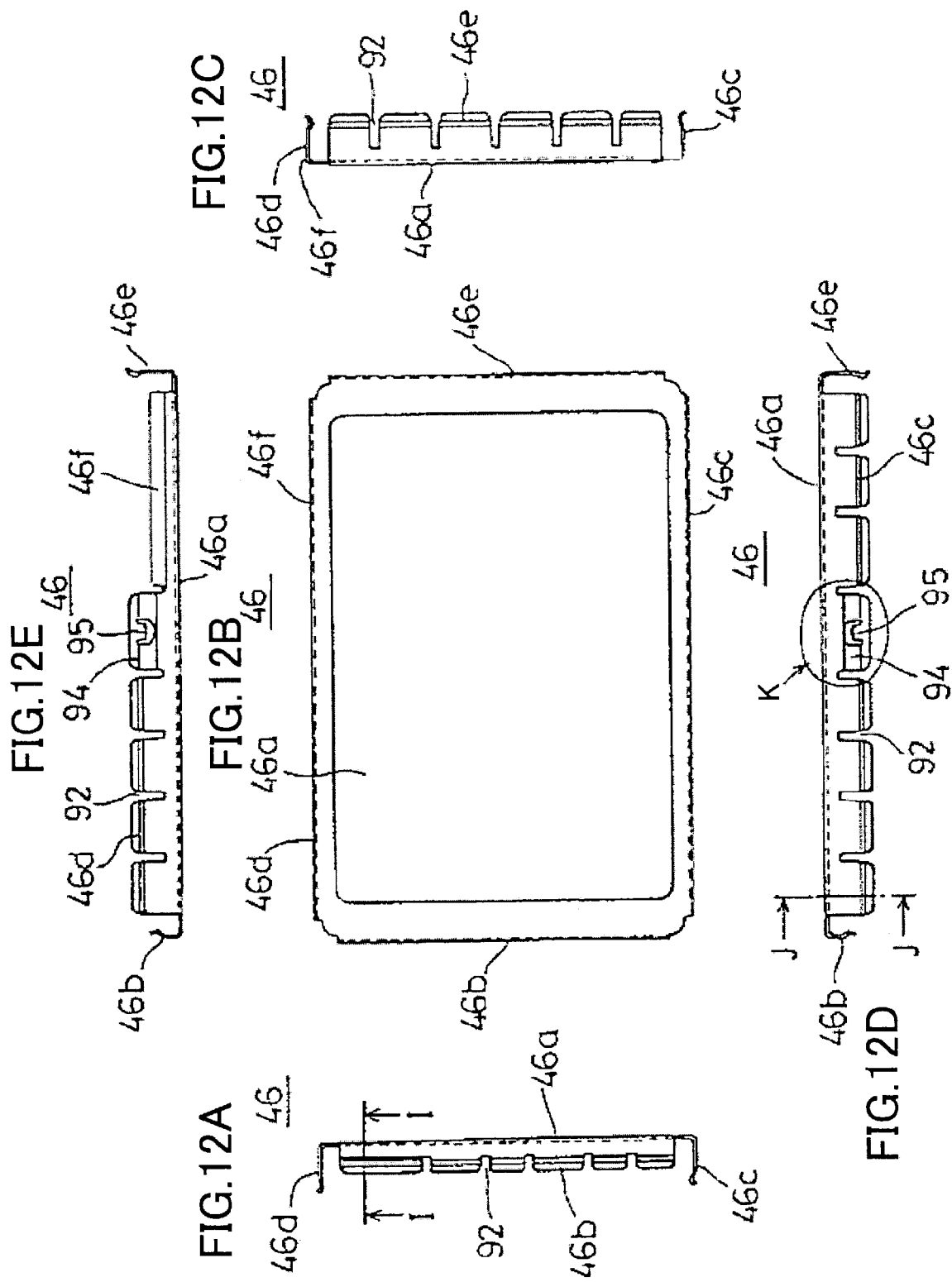

J-J

I-I

SHIELDING CASE FOR ELECTRONIC DEVICES

BACKGROUND OF THE INVENTION

1. Field of the Invention

The present invention relates to a shielding case for electronic devices and more particularly to a shielding case that is used for housing a circuit board on which an electronic component and a connector are mounted.

2. Description of the Related Art

In general, electronic devices such as AM (Amplitude Modulation) tuners and FM (Frequency Modulation) tuners require shielding cases. Illustratively, a typical AM/FM tuner is made up of an AM input connector to which an AM antenna wire is connected, an FM input connector to which an FM antenna wire is connected, various electronic components (such as an FM front-end section to which FM signals received from the FM antenna wire are input, an AM front-end section to which AM signals received from the AM antenna wire are input, a PLL (Phase Locked Loop) section that sets an input thereof to a chosen frequency and outputs it, and an FM/AM stereophonic demodulation section that demodulates received FM or AM signals and produces audio signals) and an output connector for outputting audio signals (the audio signals produced by the demodulation) to an external device such as an amplifier. They are located on the top and bottom surfaces of a printed circuit board. The periphery of the printed circuit board is surrounded by a shielding case that is formed in the shape of a box.

A typical conventional shielding case for an electronic device has a sealed up structure that houses the above stated printed circuit board within the case for the purpose of blocking off external electromagnetic noise. The AM input connector, the FM input connector, and the output connector are exposed at side surfaces of the case.

Such a conventional shielding case generally has an opening for insertion of a cable. The opening is formed at a position facing a side surface of the output connector soldered on the printed circuit board. Therefore, a cable that is connected to the amplifier, etc. can be inserted through the opening and can be connected to the output connector after the shielding case is completely assembled on the printed circuit board.

Thus, the conventional shielding case has a configuration that is suitable for leading out the output cable laterally. However, depending on its position in relation to nearby equipment (for example, the amplifier), there are some situations where it becomes more advantageous to lead out the cable in any other direction, for example, upward relative to the shielding case. However, the conventional shielding case of the box-type shape does not have an opening except in the sidewall of the case. Therefore, vertical-insertion type connectors cannot be used with such conventional box-type shielding cases, and only a limited variety of connectors can be employed.

SUMMARY OF THE INVENTION

It is therefore an object of the present invention to provide a shielding case that enables employment of a wide variety of connectors, including vertical-insertion type connectors.

Thus, according to the present invention there is provided a shielding case that houses a circuit board on which an electronic component and a connector are mounted, the shielding case defining a recessed portion by its case wall, wherein the recessed portion is provided with an opening located in a lateral direction from the mounting position of the connectors, wherein the recessed portion is provided with another opening located in an upward direction from the mounting position of the connector.

Such a shielding case allows insertion of a cable either from the top or sideways relative to the connector. Thus, it becomes possible, for example, to selectively employ one of a horizontal-insertion type connector that has pin holes on its side surface and a. vertical-insertion type connector that has pin holes on its top surface as a connector mounted on the printed circuit board for the purpose of electrically connecting the electronic device with the external electric devices. Thus, the shielding case allows such a flexible choice based on the preferences of users. As a result, not only a wider variety of connectors but also a wider variety of mounting forms of connectors can be employed with the shielding case of the present invention. Thus, the shielding case of the present invention is applicable to a considerably larger number of types of devices that contain circuit boards on which connectors are mounted.

According to the present invention, there is also provided a shielding case adapted to house a circuit board on which an electronic component and a connector are mounted, the shielding case defining a recessed portion by its case wall, wherein the outline of the recessed portion is generally a rectangular parallelepiped, wherein the recessed portion defines a space that has an opening that extends from a first side surface of the rectangular parallelepiped to a second side surface of the rectangular parallelepiped across the border of the first and second side surfaces, wherein the second side surface is perpendicular to the first side surface, wherein the opening has an shape that allows the connector to be mounted within the space though the opening.

According to the present invention, there is also provided a shielding case adapted to house a circuit board on which an electronic component and a connector are mounted, the shielding case defining a recessed portion by its case wall, wherein the shielding case comprises a housing body, a first housing cover, a second housing cover, each made of shielding material, wherein the circuit board has a generally planar shape defined by a first surface and a second surface, wherein the second surface face is the reverse surface of the first surface, wherein the mounting position of the electronic component and the mounting position of the connector are both on the first surface, wherein the housing body comprises housing walls that surround the mounting position of the electronic component along the first surface, wherein the housing walls extend away from the first surface in a perpendicular direction with respect to the first surface, wherein the housing walls define a housing opening that faces the circuit board and the mounting position of the electronic component, wherein the first housing cover faces the housing opening and the mounting position of the electronic component, when the first housing cover is mounted at a predetermined location of the housing body, wherein the second surface of the circuit board is completely faced by the second housing cover, when the second housing cover is mounted at a location that is closer to the circuit board than the predetermined location, wherein the recessed portion is substantially defined by the housing body and the second housing cover, wherein the mounting position is within the recessed portion, wherein the shielding case is open to the outside in a direction, as seen from the mounting position of the connector, perpendicularly away from the circuit board, and wherein the shielding case is open to the outside in a direction, as seen from the mounting position of the connector, perpendicularly away from the housing body.

According to the present invention, there is also provided a shielding case that houses a circuit board on which an electronic component and a connector are mounted, the shielding case defining a recessed portion by its case wall, wherein the recessed portion is open to the outside in a lateral direction from the mounting position of the connector, wherein the recessed portion is open to the outside in a vertical direction from the mounting position of the connector, wherein the shielding case further comprises an aperture in its case wall, wherein the aperture faces a side surface of the connector mounted on the circuit board.

Preferably, each of the above shielding cases may be configured in such a manner as to be capable of being selectable from one of the postures of standing in a vertical direction and lying in a horizontal direction.

Other features that may be employed to help further achieve the object of the present invention together with the advantageous effects will become apparent by reference to the following detailed description when considered in connection with the accompanying drawings.

BRIEF DESCRIPTION OF THE DRAWINGS

FIG. 2A through FIG. 2E show the shielding case in an assembled state, seen from various directions, i.e., a front elevation in FIG. 2A, a plan view in FIG. 2B, a rear elevation in FIG. 2C, a right side elevation in FIG. 2D and a left side elevation in FIG. 2E;

FIG. 4A through FIG. 4E show the housing in more detail with a front elevation in FIG. 4A, a plan view in FIG. 4B, a rear elevation in FIG. 4C, a right side elevation in FIG. 4D and a left side elevation in FIG. 4E;

FIG. 6A through FIG. 6D show parts of the housing 42 in more detail, wherein FIG. 6A is a section view taken along line A—A of FIG. 4D, FIG. 6B is a section view taken along line B—B of FIG. 4D, FIG. 6C is a section view taken along line C—C of FIG. 4D and FIG. 6D is a section view taken along line D—D of FIG. 4D;

FIG. 12A through FIG. 12E show a lower cover 46 of the shielding case with a front elevation in FIG. 12A, a bottom plan view in FIG. 12B, a rear elevation in FIG. 12C, a left side-elevation in FIG. 12D and a right side elevation in FIG. 12E;

DETAILED DESCRIPTION OF THE PREFERRED EMBODIMENTS

Now, embodiments of the present invention are described below with reference to the attached drawings.

Figure 1:
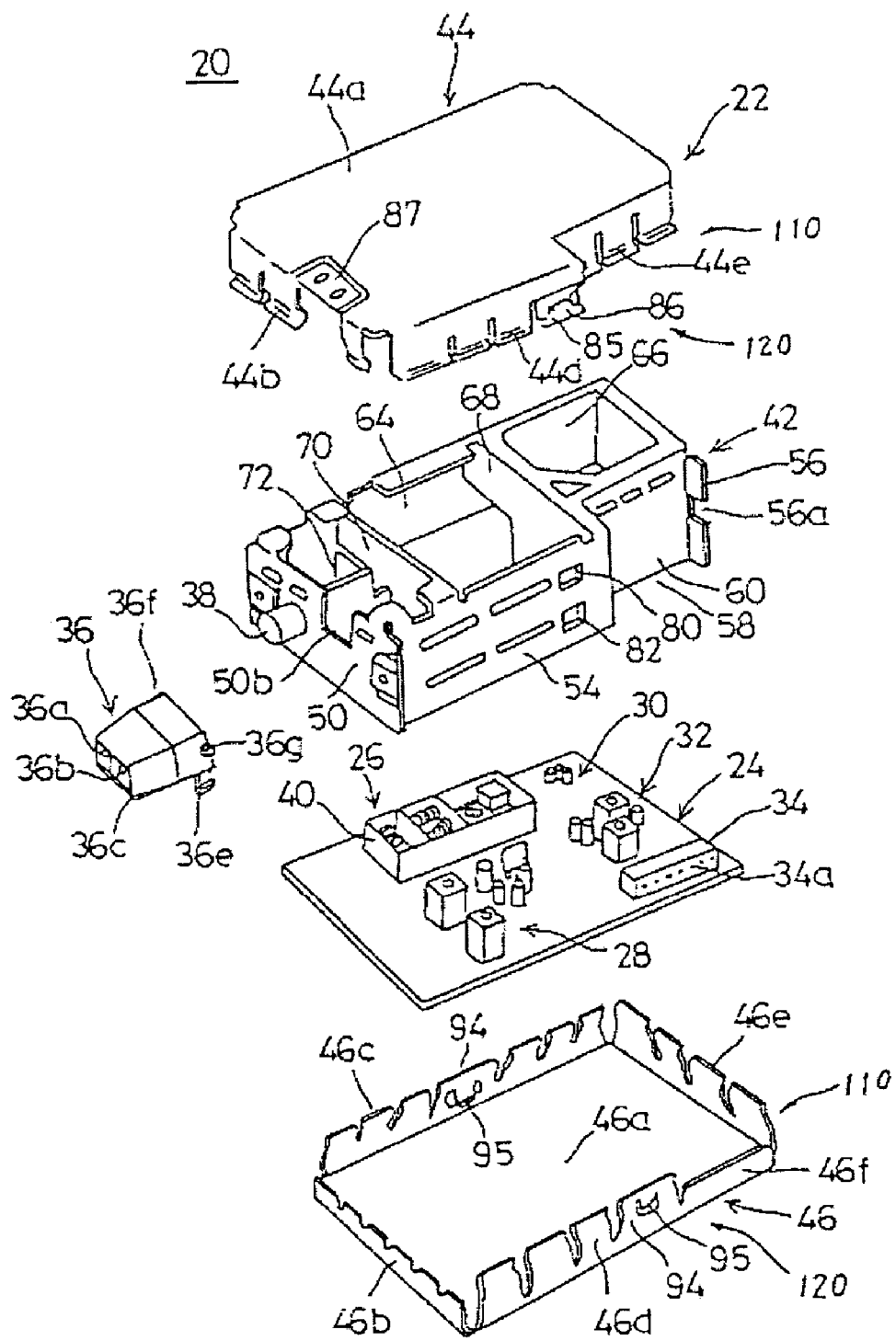
FIG. 1 is an exploded perspective view of a shielding case of the present invention, showing an illustrative circuit board with an illustrative input connector 36 and an illustrative output connector 34.

FIG. 1 is an exploded perspective view of a shielding case of the present invention and FIG. 2A through FIG. 2E show the shielding case in an assembled state, seen from various directions. More specifically, FIG. 2A through FIG. 2E are a front elevation, a plan view, a rear elevation, a right side elevation and a left side elevation, respectively.

As shown in these figures, an electronic device 20 (which is, for example, an AM/FM tuner) is configured by housing a printed circuit board 24 within a sealed space of a shielding case 22. An FM front-end section 26 to which FM signals received from an FM antenna wire (not shown in the drawings) are input, an AM front-end section 28 to which AM signals received from an AM antenna wire (not shown in the drawings) are input, a PLL (Phase Locked Loop) section 30 that sets an input thereof to a chosen frequency and outputs it, and an FM/AM stereophonic demodulation section 32 that demodulates received FM or AM signals and produces audio signals, other various electronic components, and an output connector 34 for outputting the audio signals produced by the demodulation to an external amplifier, etc. are located on the printed circuit board 24 by soldering.

The output connector 34, and variable resistors and coils for various circuits are located on the top surface of the printed circuit board 24. IC chips and DIP components are located on the bottom surface of the printed circuit board 24. A plurality of pin-holes 34*a* arranged in a row adapted for insertion of pins of a terminal of a cable or the like (not shown in the figures) are provided in a side-surface of the output connector 34. A right-side side-surface of the shielding case 22 faces this side-surface of the output connector 34.

An AM input connector 36 and an FM input connector 38 attached on a front surface of the shielding case 22 are in an exposed state (i.e., without covering). The AM input connector 36 has pin-holes 36*a* and 36*b* adapted for insertion of a pair of AM antenna wires on the front side. A control lever 36*c* for locking the AM antenna wires inserted into the pin-holes 36*a* and 36*b* is rotatably provided on the bottom side of the AM input connector 36. The AM input connector 36 has a pair of locking claws 36*d* and 36*e* on its bottom surface side (only the claw 36*e* can be seen in FIG. 1 since the claw 36*d* is on the opposite side). The locking claws 36*d* and 36*e* are fitted into and locked at a pair of locking holes (not shown in FIG. 1) of the printed circuit board 24. The AM input connector 36 has a pair of protrusions 36*f* and 36*g* on its lateral sides respectively. The protrusions 36*f* and 36*g* are fitted into recessed portions 72*a* and 74*a* of the shielding case 22 for positioning purposes (which is described later). Thus, the protrusions 36*f* and 36*g* are positioned. The FM input connector 38 has a cylindrical portion fixed directly on the front surface of the shielding case 22.

Each of the coils that constitute the FM front end section 26 is housed within a space. The space is surrounded by a shielding member 40 mounted on the printed circuit board 24.

The shielding case 22 is made up of a housing 42, an upper cover 44 and a lower cover 46. The housing 42 is formed in such a manner as to be able to surround the various electronic components located on the top surface of the printed circuit board 24. The upper cover 44 is mounted on an upper part of the housing 42 in such a manner as to close an upper opening of the housing 42. The lower cover 46 is mounted on a lower part of the housing 42 in such a manner as to face the bottom surface of the printed circuit board 24. Thus, the various electronic components soldered on the top and bottom surfaces of the printed circuit board 24 are housed within a sealed enclosures formed by the housing 42, the upper cover 44 and the lower cover 46, and are therefore shielded from external electromagnetic waves.

More specifically, the upper cover 44 and the lower cover 46 close the upper opening and a lower opening, respectively, of the housing 42. Then, in this state, the upper cover 44 and the lower cover 46 are locked with each other by means of first locking mechanisms 110 and second locking mechanisms 120. The first locking mechanisms 110 are provided on all four sides (i.e., in all four directions) of the upper cover 44 and the lower cover 46. The second locking mechanisms 120 are provided on central portions of the right and left sides of the upper cover 44 and the lower cover 46. Further details of the first locking mechanisms 110 and the second locking mechanisms 120 are described later.

Figure 3A:
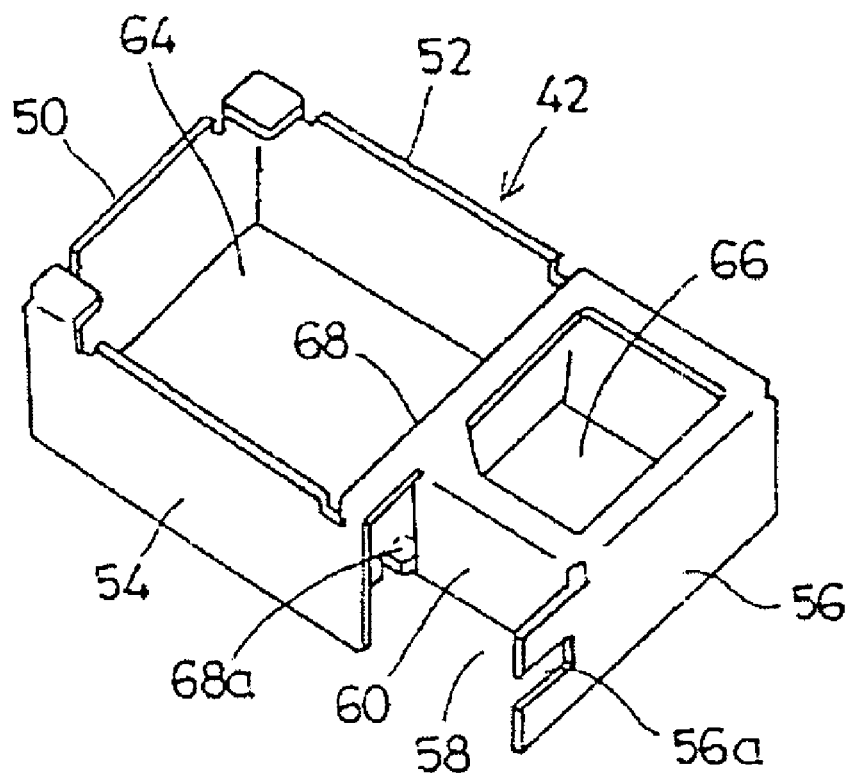
FIG. 3A and FIG. 3B show a housing 42 of the shielding case, seen from various directions, i.e., a perspective view in FIG. 3A and a detailed view of a part of the housing in FIG. 3B.
Figure 3B:
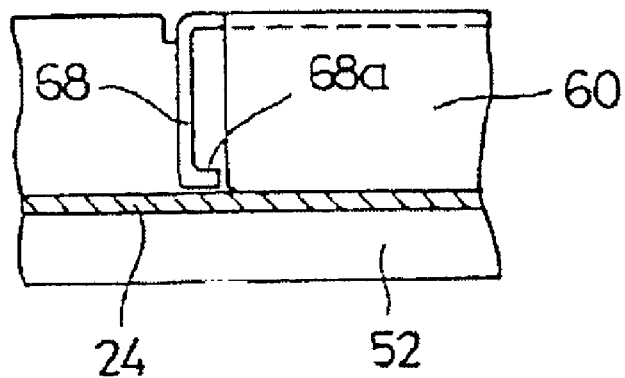

FIG. 3A and FIG. 3B show the housing 42 of the shielding case, in a perspective view and in a detailed view of a part of the housing, respectively. FIG. 4A through FIG. 4E show the housing 42 in a front elevation, a plan view, a rear elevation, a right side elevation and a left side elevation, respectively.

As shown in FIG. 3A and FIG. 3B, and FIG. 4A through FIG. 4E, the housing 42 is formed in the shape of a frame by pressing sheet metal made of shielding material that shields electromagnetic waves. The housing 42 has a front plate 50, a left plate 52 located at the left side of the printed circuit board 24, a right plate 54 located at the right side of the printed circuit board 24, a back plate 56 located at the back of the printed circuit board 24, a recessed portion 58 and a side plate 60 of the recessed portion. The AM input connector 36 and the FM input connector 38 are mounted on the front plate 50. The recessed portion 58 is formed at the right side wall of the case in such a manner as to expose the output connector 34. The side plate 60 is located on the right side surface of a second compartment 66 (which is described below) and defines the recessed portion 58.

Specifically, a first compartment 64 and the second compartment 66 are provided on the top surface of the printed circuit board 24 in the interior space of the housing 42. The first compartment 64 houses electronic components of the FM front end section 26 and the AM front end section 28. The second compartment 66 houses electronic components of the PLL section 30 and the FM/AM stereophonic demodulation section 32. The aforementioned partition wall 68 separates the first compartment 64 and the second compartment 66. A partition plate 70 that is parallel to the front plate 50 is laid across the first compartment 64.

The front plate 50 has a mounting hole 50*a* in which the cylindrical FM input connector 38 is fixed, a recessed portion 50*b* in which the AM input connector 36 is fitted and a pair of screw holes 50*c* and 50*d*. The screw holes 50*c* and 50*d* can be used for fixing the shielding case 22 to an external structure. The external structure may be a chassis beside the device. A pair of supporting plates 72 and 74 formed by bending are provided between the partition plate 70 and the front plate 50. The supporting plates 72 and 74 support respective sides of the AM input connector 36 inserted in the recessed portion 50*b*. Further, end portions of the supporting plates 72 and 74 are engaged with the partition plate 70 and function as reinforcing members.

The aforementioned recessed portions 72*a* and 74*a*, with which the aforementioned pair of protrusions 36*f* and 36*g* of the AM input connector 36 are engaged, are located at upper ends of the supporting plates 72 and 74. As stated above, these recessed portions 72*a* and 74*a* are located for the purpose of positioning the AM input connector 36. These recessed portions 72*a* and 74*a* control the mounting position of the AM input connector 36. The partition plate 70 has a protrusion 70*a* that protrudes in such a manner as to control the position of a back surface of the AM input connector 36.

The partition wall 68, the aforementioned recession-side plate 60, the left plate 52 and the back plate 56, which surround the second compartment 66, have L-shaped upper end portions formed by bending. The L-shaped upper end portions increase the rigidity. The aforementioned recessed portion 58 is formed at a position where the output connector 34 is mounted. The recessed portion 58 has a lateral opening, an upper opening and a lower opening in such a manner that the output connector 34 located on the printed circuit board 24 can be seen from above and can be seen from the side. Therefore, when the terminal pins of a terminal of a flat cable or the like (not shown in the figures) are inserted into the aforementioned pin holes 34a of the output connector 34, the inserting operations can be performed from above or from the side, of the output connector 34.

Figure 5A:
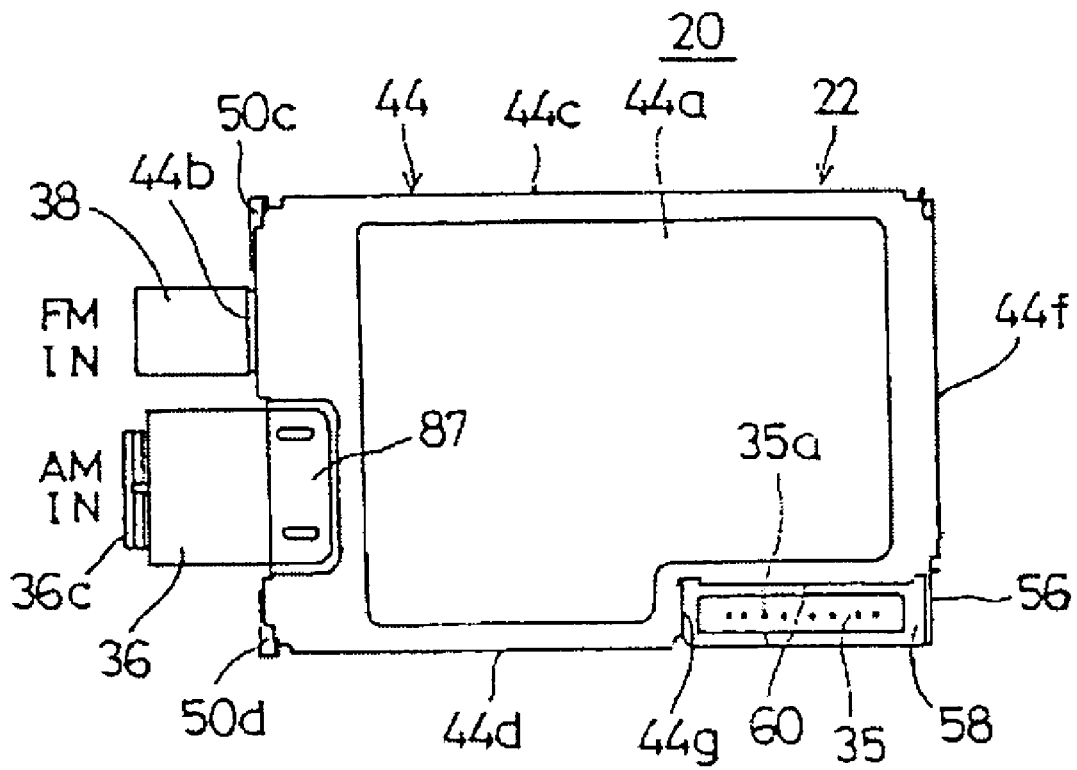
FIG. 5A and FIG. 5B show a vertical-insertion type connector 35 mounted on the circuit board, seen from various directions, i.e., a plan view in FIG. 5A and a right side elevation in FIG. 5B.
Figure 5B:
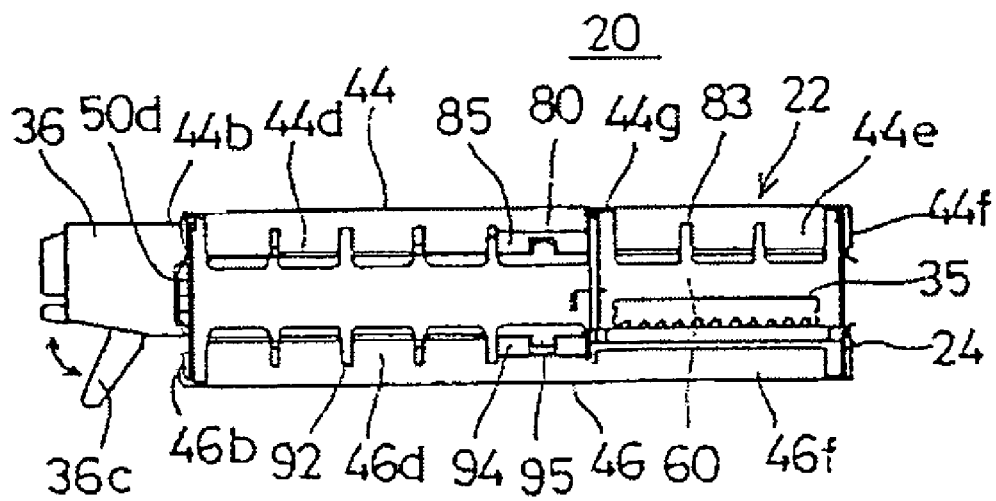

The output connector 34 as shown in FIG. 2 is a horizontal-insertion type connector that has the pin holes 34a at its side surface. Also, according to the present invention, it becomes possible to mount a vertical-insertion type connector 35 on the printed circuit board 24. The vertical-insertion type connector 35 as shown in FIG. 5A and FIG. 5B has pin holes 35a at its top surface. Therefore, it becomes possible to selectively employ one of the horizontal-insertion type connector 34 having the pin holes 34a at its side surface and the vertical-insertion type connector 35 having the pin holes 35a at its top surface.

The aforementioned recession-side plate 60 has an upper end that extends between and connects the partition wall 68 and the back plate 56. The aforementioned recession-side plate 60 has a lower end that abuts on the top surface of the printed circuit board 24. Further, the left end of the recession-side plate 60 abuts on the aforementioned jutting portion 68a formed by cutting and bending a portion of the partition wall 68. The abutting of the recession-side plate 60 on the jutting portion 68a (as shown in FIGS. 3A and 3B) controls the motion of the recession-side plate 60. Therefore, the recession-side plate 60 is kept from being unsettled before assembling processes. Usually, there is a clearance between the partition wall 68 and the recession-side plate 60, and, without the jutting portion 68a, there is a possibility that the recession-side plate 60 becomes unsettled before assembling processes.

Further, an aperture 56a is formed in a portion of the back plate 56 (of the case wall) that faces a side surface of the output connector 34. The aperture 56a is formed in such a manner that the side surface of the output;connector 34 can be seen from the back side of the case 22. The aperture 56a is formed as shown in FIG. 1, FIG. 2C, FIG. 3A and FIG. 4A. Specifically, the aperture 56a is formed in the shape of a quadrangular cutout, or more specifically, a rectangular one that reaches the right-side side-surface of the case 22. Further details of the present invention with respect to this aperture 56a and its variants are described later with reference to these figures together with FIGS. 16 through 19.

Referring to FIG. 4, the front plate 50, the left plate 52, the right plate 54, the rear plate 56 and the recession-side plate 60 have upper protrusions 76 located at predetermined intervals and adapted for locking peripheral portions (which are described later) of the upper cover 44. The front plate 50, the left plate 52, the right plate 54, the rear plate 56 and the recession-side plate 60 also have lower protrusions 78 located at predetermined intervals and adapted for locking peripheral portions (which are described later) of the lower cover 46. Each of these upper and lower protrusions 76 and 78 has a curved or round shape in its cross section. These upper and lower protrusions 76 and 78 are formed in such a manner that the peripheral portions of the upper and lower covers 44 and 46, respectively, can ride over and catch them, which is described later with reference to FIGS. 8A and 8B.

Further, a generally rectangular upper locking hole 80 and a generally rectangular lower locking hole 82 are formed in the intermediate portions of both the left plate 52 and the right plate 54. The upper locking hole 80 prevents the upper cover 44 from being disengaged. The lower locking hole 82 prevents the lower cover 46 from being disengaged.

Further, as shown in FIG. 4, fixing portions 84 that are to be fixed by soldering on peripheral portions of the printed circuit board 24 are provided with the left plate 52, the right plate 54 and the rear plate 56. These fixing portions 84 are generally elongated and, when assembling, they are bent inwardly in such a manner as to abut on the peripheral portions of the printed circuit board 24, and, in this state, they are soldered to the peripheral portions of the printed circuit board 24.

Figure 6A:
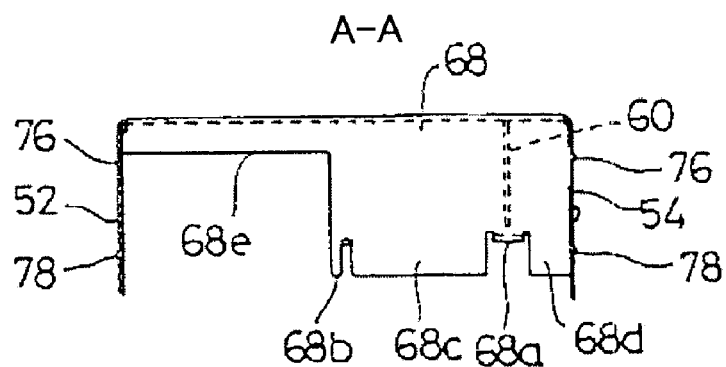
Figure 6B:
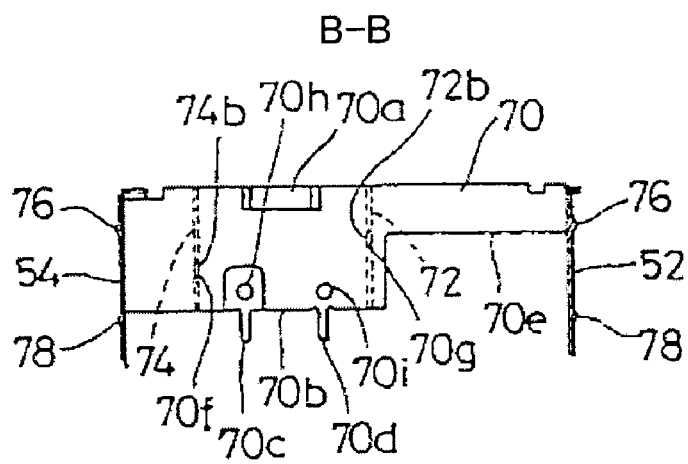
Figure 6C:
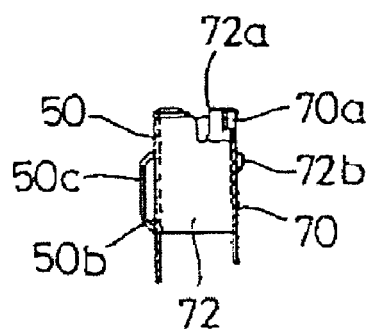
Figure 6D:
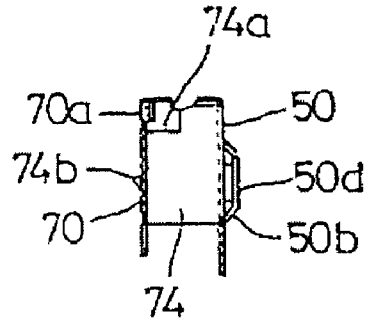

FIG. 6A through FIG. 6D show parts of the housing 42 in more detail. FIG. 6A is a section view taken along line A—A of FIG. 4D. FIG. 6B is a section view taken along line B—B of FIG. 4D. FIG. 6C is a section view taken along line C—C of FIG. 4D. FIG. 6D is a section view taken along line D—D of FIG. 4D.

As shown in FIG. 6A, the aforementioned partition wall 68 is laterally laid between and bridging the left plate 52 and the right plate 54. The partition wall 68 has the aforementioned jutting portion 68a and also has plug portions 68b through 68d that are fitted into slits (not shown in the figures) formed at the printed circuit board 24. Further, the partition wall 68 has a clearance-defining portion 68e that is formed in such a manner as to define a clearance to the shielding member 40 on the printed circuit board 24. In other words, the portion 68e does not abut on the member 40.

The plug portion 68b has an elongated shape that protrudes downward. The plug portion 68b is positioned in such a manner as to extend through the printed circuit board 24 and is soldered at the bottom surface of the printed circuit board 24.

As shown in FIG. 6B, the aforementioned partition plate 70 has the aforementioned protrusion 70a and an abutting portion 70b that abuts on the printed circuit board 24. The partition plate 70 also has plug portions 70c and 70d that protrude downward from the end portion of the abutting portion 70b and are fitted into slits (not shown in the figures) formed at the printed circuit board 24. Further, the partition plate 70 has a clearance-defining portion 70e that is formed in such a manner as to define a clearance to the shielding member 40 on the printed circuit board 24. In other words, the portion 70e does not abut on the member 40. Further, the partition plate 70 has locking holes 70f through 70i. Protrusions 72b and 74b of the aforementioned supporting plates 72 and 74 are fitted in the locking holes 70g and 70f, respectively. The aforementioned protrusions (not shown in the figures) at the back-side surface of the AM input connector 36 that are formed for positioning purpose are fitted in the locking holes 70h and 70i.

As shown in FIG. 6C, the supporting plate 72 formed by bending inwardly from the front plate 50 has the (positioning) recessed portion 72a that controls the mounting position of the AM input connector 36. The supporting plate 72 has the protrusion 72b that is fitted in the locking hole 70f of the partition plate 70.

As shown in FIG. 6D, the supporting plate 74 formed by bending inwardly from the front plate 50 has the (positioning) recessed portion 74a that controls the mounting position of the AM input connector 36. The supporting plate 72 has the protrusion 74b that is fitted in the locking hole 70g of the partition plate 70.

Figure 7C:
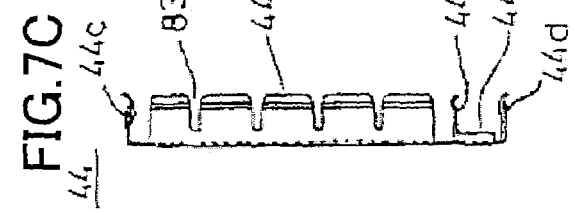
FIG. 7A through FIG. 7E show an upper cover 44 of the shielding case in more detail with a front elevation in FIG. 7A, a plan view in FIG. 7B, a rear elevation in FIG. 7C, a right side elevation in FIG. 7D and a left side elevation in FIG. 7E.
Figure 7E:
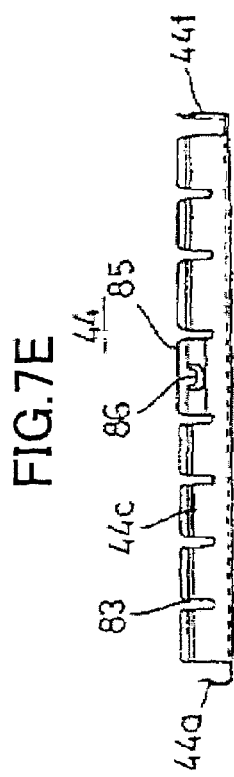
Figure 7B:
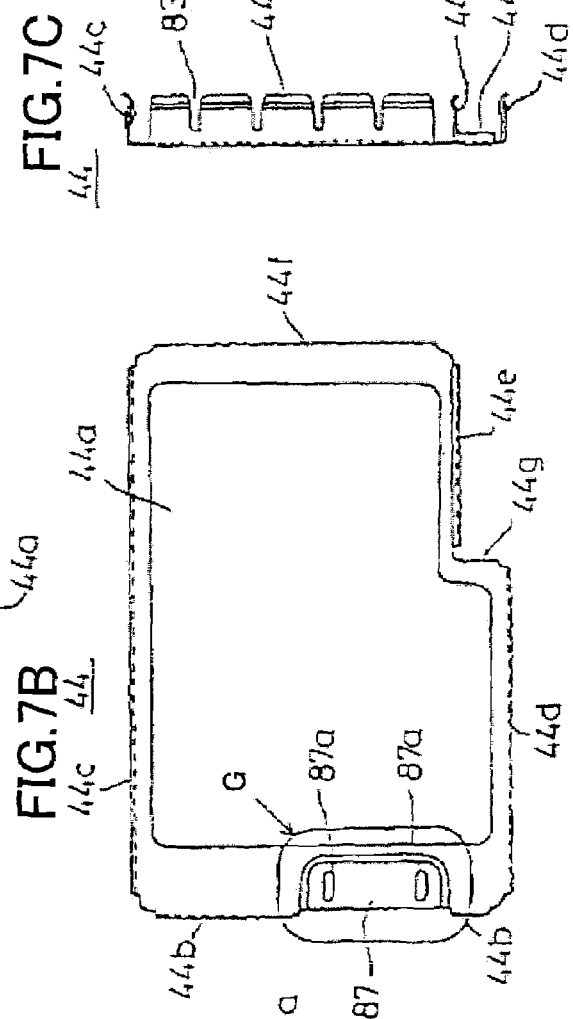
Figure 7D:
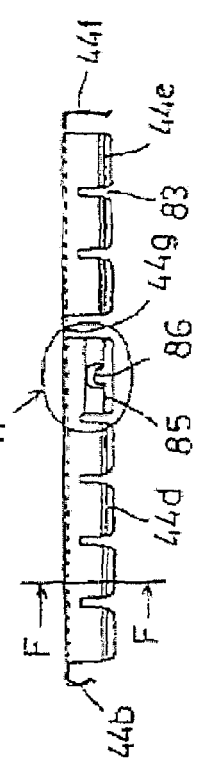
Figure 7A:
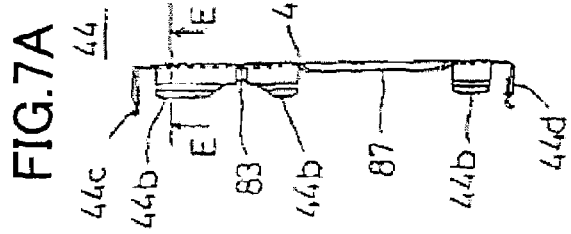

FIG. 7A through FIG. 7E show the upper cover 44, with a front elevation in FIG. 7A, a plan view in FIG. 7B, a rear elevation in FIG. 7C, a right side elevation in FIG. 7D and a left side elevation in FIG. 7E.

As shown in FIG. 7A through FIG. 7E, the upper cover 44 has a top surface 44a, front catching portions 44b, left catching portions 44c, right catching portions 44d, second right catching portions 44e, rear catching portions 44f and a third right catching portion 44g. The top surface 44a closes the upper opening of the housing 42. The front catching portions 44b are bent to the front side of the top surface 44a. The left catching portions 44c are bent to the left side of the top surface 44a. The right catching portions 44d are bent to the right side of the top surface 44a. The second right catching portions 44e are bent to the right side of the top surface 44a corresponding to the aforementioned clearance-defining portion 68e. The rear catching portions 44f are bent to the rear side of the top surface 44a. The third right catching portion 44g is bent corresponding to the clearance-defining portion 68e.

The front catching portions 44b, the left catching portions 44c, the right catching portions 44d, the second right catching portions 44e and the rear catching portions 44f define cutouts 83 at predetermined intervals so that they can easily catch the upper protrusions 76 of the front plate 50, the left plate 52, the right plate 54, the recession-side plate 60 and the rear plate 56 of the housing 42, respectively.

Further, a connector holder portion 87 is provided in a recessed manner on the top surface 44a. The connector holder portion 87 holds the AM input connector 36 from above by abutting on the top surface of the AM input connector 36. Further, locking members 86 are provided in the aforementioned locking parts 85 in the central portion of the plurality of left catching portions 44c and in the central portion of the plurality of right catching portions 44d that are bent downward from respective sides of the top surface 44a. These locking members 86 are fitted in the upper locking holes 80 of the housing 42 so as to prevent disengagements.

Figure 8A:
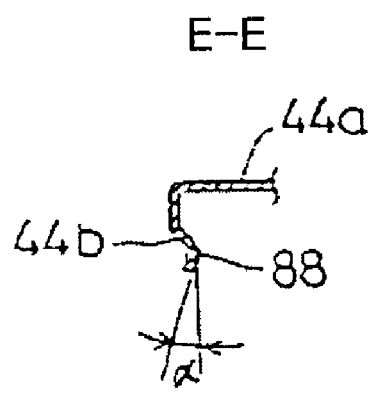
FIG. 8A and FIG. 8B show the shape of a catching portion of the cover 44, seen from various directions, i.e., a section view taken along line E—E of FIG. 7A and a section view taken along line F—F of FIG. 7D, respectively.
Figure 8B:
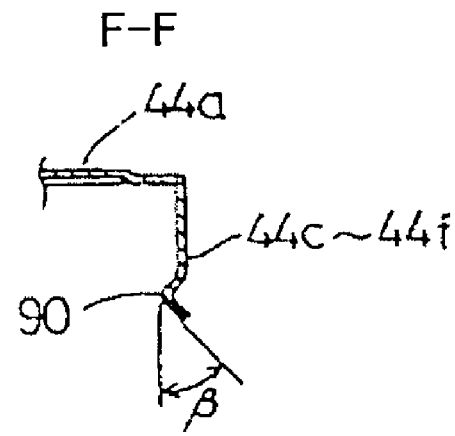

As shown in FIGS. 8A and 8B, the front catching portions 44b, the left catching portions 44c, the right catching portions 44d, the second right catching portions 44e and the rear catching portions 44f have distal portions 88 and 90, each of which is formed by bending in the shape of an elbow in the sectional view. When these bent portions respectively begin to ride on the aforementioned round upper protrusions 76 of the front plate 50, the left plate 52, the right plate 54, the recession-side plate 60 and the rear plate 56 of the housing 42, these bent portions are further deformed in such a manner that the shown bent angles "and" are increased, thereby facilitating the engagement of the catching portions and the upper protrusions 76. Therefore, the front catching portions 44b, the left catching portions 44c, the right catching portions 44d, the second right catching portions 44e and the rear catching portions 44f can respectively catch the corresponding upper protrusions 76 by having the distal portions 88 and 90 ride over the upper protrusions 76. In this way, the upper cover 44 is kept from disengaging or coming off upward, at its four sides.

Figure 9A:
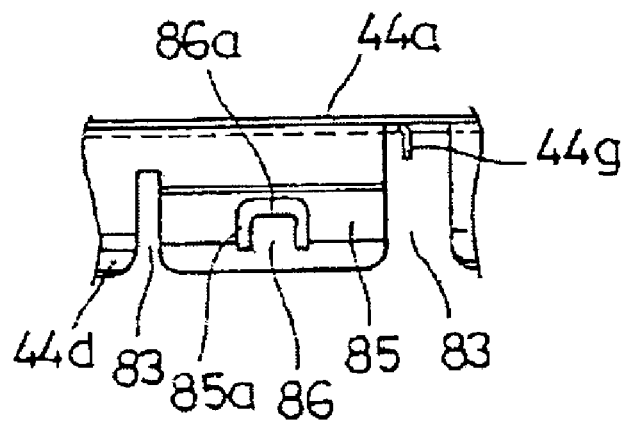
FIG. 9A and FIG. 9B show the shape of a locking part 85 of the cover 44, seen from various directions, i.e., a right side elevation and a section view, respectively.
Figure 9B:
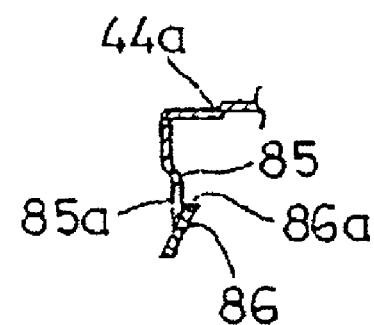

As shown in FIGS. 9A and 8B, a slit 85a is formed in the shape of a horseshoe at the center of each of the locking portions 85 (only one of locking portions 85 is shown in FIGS. 9A and 8B) that are bent downward from both sides of the top surface 44a. Each locking member 86 is partly surrounded by a slit 85a. The lower end of the locking member 86 is united with the locking portion 85. The locking member 86 is formed in such a manner that the upper end 86a of the locking member 86 is inclined to the inside.

Figure 10A:
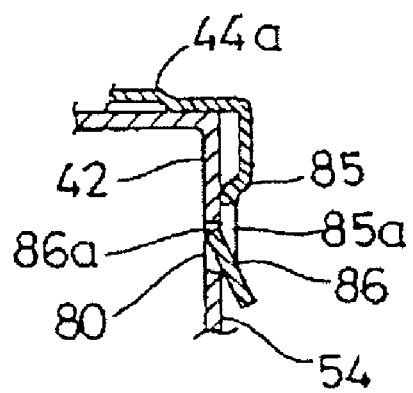
FIG. 10A and FIG. 10B show the locking part 85 locked at the housing 42, seen from various directions, i.e., a section view and a right side elevation, respectively.
Figure 10B:
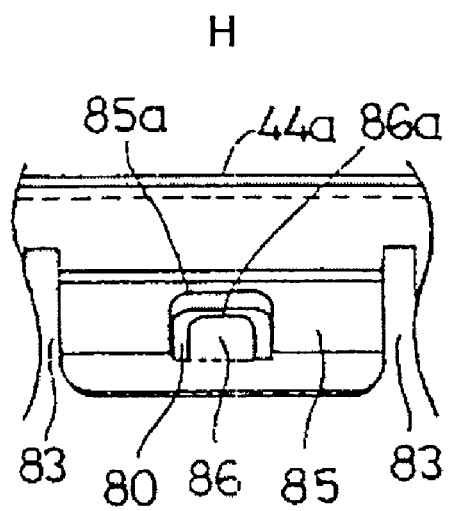

As shown in FIGS. 10A and 10B, when the upper cover 44 is mounted on the upper portion of the housing 42, the upper end portion 86a of the locking member 86 is fitted in the upper locking hole 80 of the housing 42. As a result, when an external impulsive force is exerted, the upper end portion 86a of the locking member 86 abuts on a peripheral portion of the upper locking hole 80 and, therefore, the cover 44 is reliably kept from being disengaged from the housing 42.

Figure 11A:
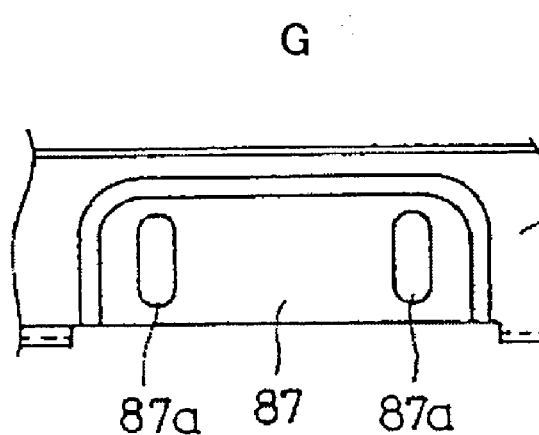
FIG. 11A and FIG. 11B show a holding portion 87 of the cover 44 in detail, seen from various directions, i.e., a plan view and a section view, respectively.
Figure 11B:
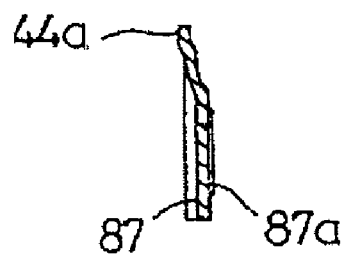

The connector holder portion 87 provided at the top surface 44a of the upper cover 44 as shown in FIGS. 11A and 11B is located at a position that faces the top surface of the AM input connector 36. Further, the connector holder portion 87 is formed at a position that is one step lower than the top surface 44a. Further, the connector holder portion 87 is configured to form a pair of abutting portions 87a in a recessed manner. The abutting portions 87a further protrude downward and abut on the top surface of the AM input connector 36. As a result, the AM input connector 36 is held between the abutting portions 87a of the connector holder portion 87 and a recessed portion 50b formed at the front plate 50 of the housing 42. Thus, the AM input connector 36 is held steadily.

FIG. 12A through FIG. 12E show the lower cover 46, with a front elevation in FIG. 12A, a bottom plan view in FIG. 12B, a rear elevation in FIG. 12C, a left side elevation in FIG. 12D and a right side elevation in FIG. 12E.

As shown in FIG. 12A through FIG. 12E, the lower cover 46 has a bottom surface 46a, front catching portions 46b, left catching portions 46c, right catching portions 46d, rear catching portions 46e and a catching portion 46f. The bottom surface 46a closes the lower opening of the housing 42. The front catching portions 46b are bent to the front side of the bottom surface 46a. The left catching portions 44c are bent to the left side of the bottom surface 46a. The right catching portions 44d are bent to the right side of the bottom surface 46a. The rear catching portions 46e are bent to the rear side of the bottom surface 46a. The catching portion 46f is bent corresponding to the clearance-defining portion 68e.

The front catching portions 46b, the left catching portions 46c, the right catching portions 46d, and the rear catching portions 46e define cutouts 92 at predetermined intervals so that they can easily catch the lower protrusions 78 of the front plate 50, the left plate 52, the right plate 54, the rear plate 56 and the recession-side plate 60 of the housing 42, respectively.

Further, locking members 95 are formed in locking parts 94 formed in the central portion of the plurality of left catching portions 46c and in the central portion of the plurality of right catching portions 46d that are bent upward from respective sides of the bottom surface 46a. These locking members 95 are fitted in the lower locking holes 82 of the housing 42 so as to prevent disengagements.

Figure 13A:
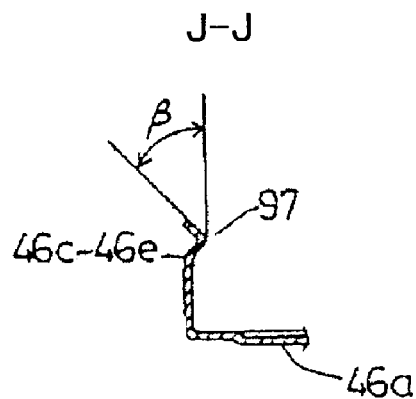
FIG. 13A and FIG. 13B show the shape of a catching portion of the lower cover 46, seen from various directions, i.e., a section view taken along line J—J of FIG. 12D and a section view taken along line I—I of FIG. 12D, respectively.
Figure 13B:
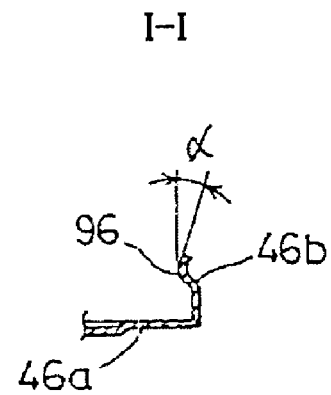

As shown in FIGS. 13A and 13B, the front catching portions 46b, the left catching portions 46c, the right catching portions 44d, and the rear catching portions 46e have distal portions 96 and 97, each of which is formed by bending in the shape of an elbow in the sectional view. When these bent portions respectively begin to ride on the lower protrusions 78 of the front plate 50, the left plate 52, the right plate 54, the rear plate 56 and the recession-side plate 60 of the housing 42, these bent portions are further deformed in such a manner that the shown bent angles "and" are increased, thereby facilitating the engagement of the catching portions and the lower protrusions 78. Therefore, the front catching portions 46*b*, the left catching portions 46*c*, the right catching portions 46*d*, and the rear catching portions 46*e* can respectively catch the corresponding lower protrusions 78 by having the distal portions 96 and 97 ride over the lower protrusions 78. In this way, the lower cover 46 is kept from disengaging or coming off downward, at its four sides.

Figure 14A:
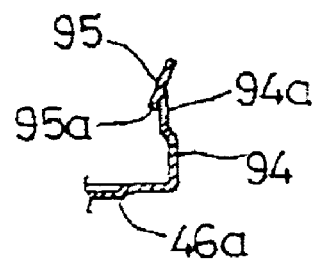
FIG. 14A and FIG. 14B show the shape of a locking part 94 of the lower cover 46, seen from various directions, i.e., a section view and a left side elevation, respectively.
Figure 14B:
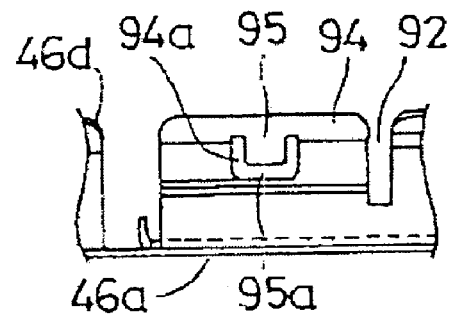

As shown in FIGS. 14A and 14B, a slit 94*a* is formed in the shape of a horseshoe at the center of each of the locking portions 94 (only one of locking portions 94 is shown in FIGS. 14A and 14B) that are bent upward from both sides of the bottom surface 46*a*. Each locking member 95 is surrounded by a slit 94*a*. The upper end of the locking member 95 is united with the locking portion 94. The locking member 95.is formed in such a manner that the lower end 95*a* of the locking member 95 is inclined to the inside.

Figure 15A:
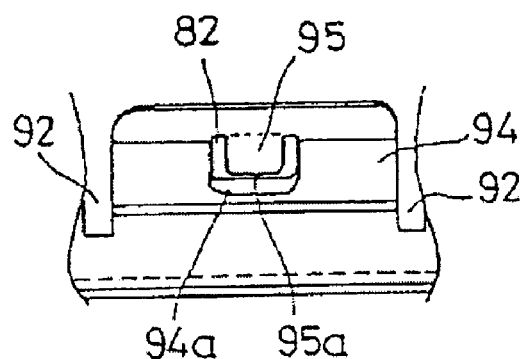
FIG. 15A and FIG. 15B show the locking part 94 locked at the housing 42, seen from various directions, i.e., a left side elevation and a section view, respectively.
Figure 15B:
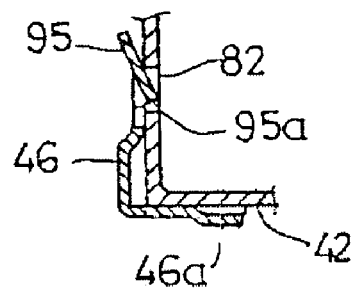

As shown in FIGS. 15A and 15B, when the lower cover 46 is mounted on the lower portion of the housing 42, the lower end portion 95*a* of the locking member 95 is fitted in the lower locking hole 82 of the housing 42. As a result, when an external impulsive force is exerted, the lower end portion 95*a* of the locking member 95 abuts on a peripheral portion of the lower locking hole 82 and, therefore, the cover 46 is reliably kept from being disengaged from the housing 42.

The above embodiment is described in conjunction with an illustrative AM/FM tuner apparatus, however, the present invention is not limited to those in conjunction with the tuner AM/FM apparatus. As will be appreciated by one of ordinary skill in the art, the present invention is applicable to other electronic devices.

The above output connectors 34 and 35 are illustrated as the types that have a plurality of pin holes 34*a* in a row and a plurality of pin holes 35*a* in a row, respectively. However, the present invention is not limited to them. For example, the present invention may employ a type of output connector that has a slit-type opening adapted for insertion of a terminal of a FFC (Flat Flexible Cable) etc., or a type of flat cable made by forming its terminal portions in the film-like insertion plate, etc.

FIGS. 16 through 19 show variants of the embodiment of the present invention with respect to the aforementioned aperture 56*a* shown in FIG. 1, FIG. 2C, FIG. 3A and FIG. 4A. As stated above, the aperture 56*a* is formed in a portion of the back plate 56 (of the case wall) that faces a side surface of the output connector 34. The aperture 56*a* is formed in such a manner that the side surface of the output connector 34 can be seen from the back side of the case 22. The aperture 56*a* is formed in the shape of a quadrangular cutout, or more specifically, a rectangular one that reaches the right-side side-surface of the case 22. Therefore, a worker that performs the assembling operation can see the mounting position of the output connector 34 through the aperture 56*a* of the back plate 56. Thus, it becomes easier to carry out the assembling operation that connects a terminal of a cable or the like (not shown in the figures) to the output connector 34. More specifically, the assembly worker can see the side surface of the connector and can see the relationship between the positions of the cable and the output connector 34 through the aperture 56*a* of the back plate 56, even when the shielding case 22 fixed on the aforementioned chassis or on a bracket (on the front side of the shielding case 22) is to be worked on. As a result, the workability is improved and, consequently, the production efficiency is increased.

From one point of view, a feature of these partial structures just mentioned here can be understood as a shielding case that houses a circuit board on which an electronic component and a connector are mounted, wherein the shielding case comprises an aperture in its case wall, wherein the aperture faces a side surface of the connector when the connector is in the mounting position. It should be noted that such a feature considered alone can be able to provide the following effects: the side surface of the connector can be seen through the aperture of the case wall; the connection point of a cable to the connector can be seen through the aperture; it becomes easier to carry out the connection of the cable to the connector; the worker can see the relationship between the positions of the cable and the connector through the aperture of the case wall from a position in the lateral side relative to the connector, even with a shielding case fixed on an external chassis or bracket; the workability is improved; the production efficiency is increased, etc. In contrast, according to a conventional shielding case, an output connector is soldered on an printed circuit board, and an opening is formed in a portion of the case wall that faces the connecting surface of the connector (i.e., front surface the connector). With this structure, a cable connected to an apparatus (for example, an amplifier) can be inserted through the opening and can be connected to the output connector. However, since most part of the output connector except the connecting surface is covered by the shielding case, the worker who connects the cable to the output connector has to make a peering action from the connecting surface side of the connector (i.e., from the side not covered by the shielding case) in order to insert the cable. Therefore, when the cable is being connected to the output connector located in the shielding case fixed on a chassis of an audio apparatus (for example, a stereo), it becomes difficult to see the connecting surface of the output connector from the side of the shielding case. Therefore, the worker tends to or sometimes has to work without looking at the exact position to connect the cable to the output cable. As a result, the work is difficult. In conclusion, with such a conventional shielding case, it is difficult to increase the efficiency of the assembling operation. Such a problem is solved by the feature of the embodiment discussed here. Therefore, not only the above illustrative portion of the embodiment teaching the structure of the aperture 56*a* formed in a portion of the back plate 56 (of the case wall) that faces the side surface of the output connector 34, but also the following first to fourth variants with respect to the aperture 56*a* are preferable.

Figure 16:
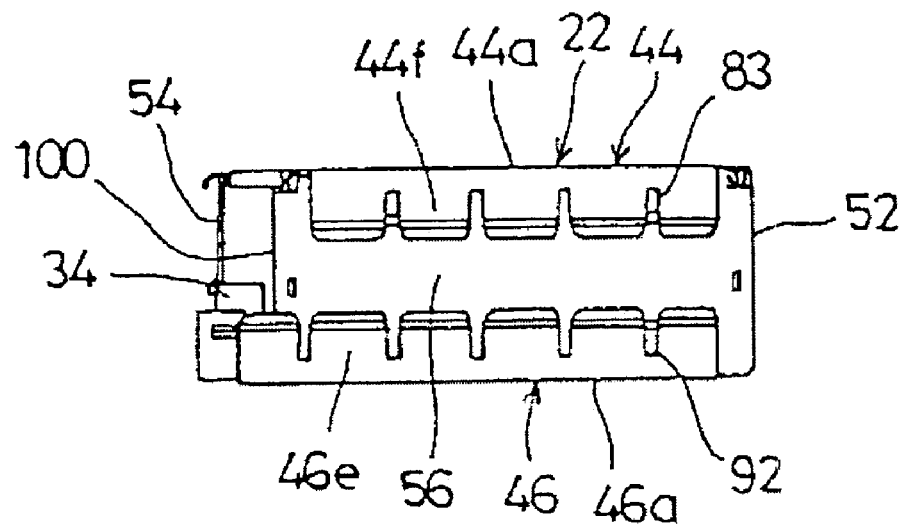
FIG. 16 is a rear elevation of a shielding case according to a first variant example.

A shielding case of the first variant is shown in FIG. 16, which is a rear elevation.

As shown in FIG. 16, the back plate 56 of the shielding case 22 of this variant is provided with an opening 100. The opening 100 is formed in such a manner as to expose the side surface and the top surface of the output connector 34 soldered on the printed circuit board 24. More specifically, the facing portion of the back plate 56 that faces the side surface of the output connector 34, together with the upper portion of the back plate 56 that is above the facing portion, are cut out to form the opening 100 shown in FIG. 16. As a result, it becomes possible to look at both the top surface and the side surface of the output connector 34 by looking from the backside of the rear plate 56 of the shielding case 22, when the assembling work is to be carried out. Consequently, it becomes easier to carry out the cable insertion/connection operation.

Figure 17:
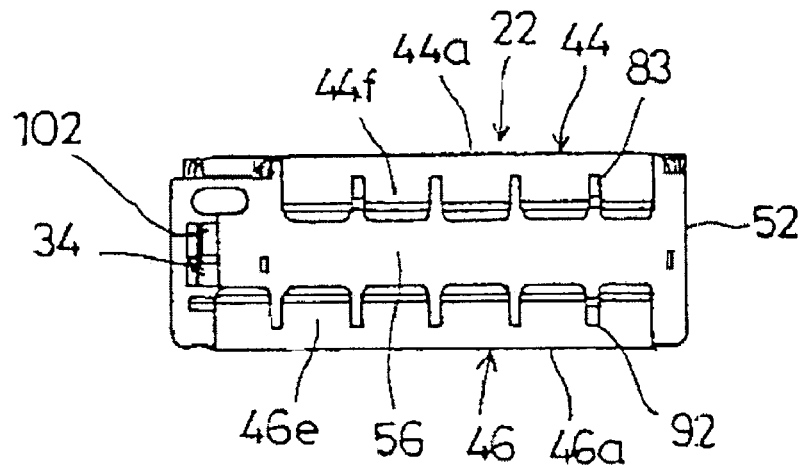
FIG. 17 is a rear elevation of a shielding case according to a second variant example.

A shielding case of the second variant is shown in FIG. 17, which is a rear elevation.

As shown in FIG. 17, the back plate 56 of the shielding case 22 of this variant is provided with a rectangular opening 102. The opening 102 is formed in such a manner as to expose a part of the side surface of the output connector 34 soldered on the printed circuit board 24. More specifically, the rectangular opening 102 is formed in the facing portion that faces the side surface of the output connector 34. As a result, it becomes possible to look at the mounting position of the output connector 34 by looking from the backside of the rear plate 56 of the shielding case 22, when the assembling work is to be carried out. Consequently, it becomes easier to carry out the insertion/connection operation with respect to a terminal of a cable or the like (not shown in the figures).

Figure 18:
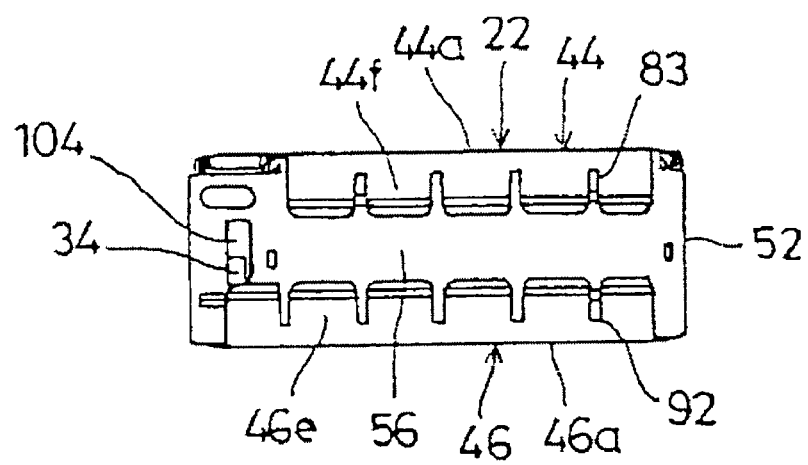
FIG. 18 is a rear elevation of a shielding case according to a third variant example.

A shielding case of the third variant is shown in FIG. 18, which is a rear elevation.

As shown in FIG. 18, the back plate 56 of the shielding case 22 of this variant is provided with an opening 104. The opening 104 is formed in such a manner as to expose the side surface and the front surface of the output connector 34 soldered on the printed circuit board 24. As a result, it becomes possible to look at both the front surface and the side surface of the output connector 34 by looking from the backside of the rear plate 56 of the shielding case 22, when the assembling work is to be carried out. Consequently, it becomes easier to carry out the cable insertion/connection operation by checking the relationship between the positions of the terminal of a cable or the like (not shown in the figures), and the output connector 34.

Figure 19:
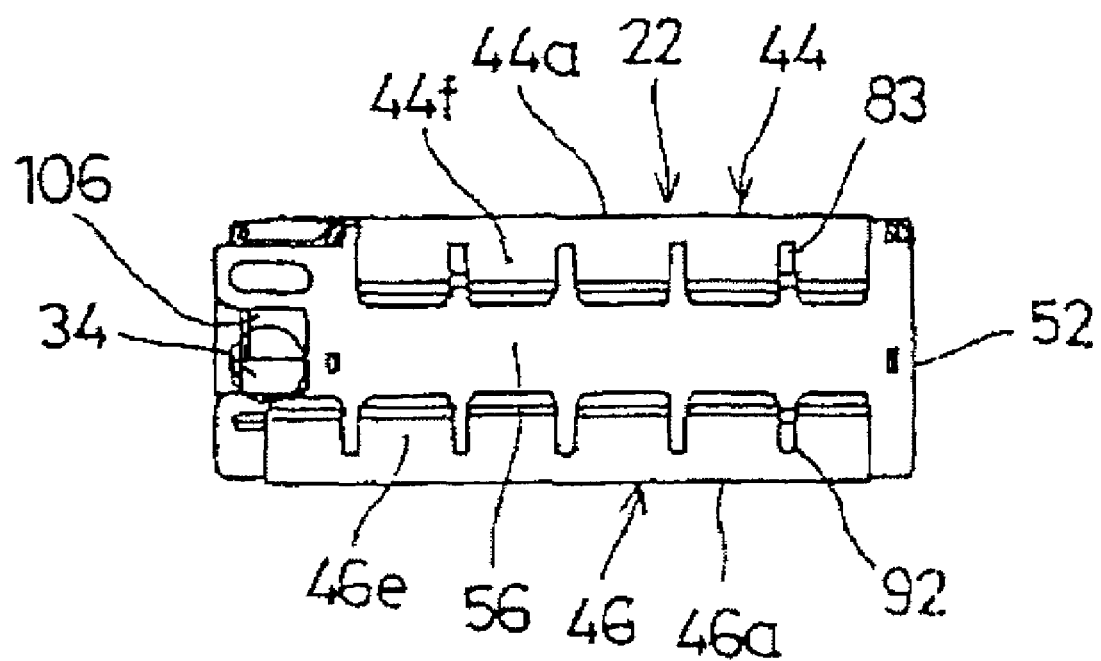
FIG. 19 is a rear elevation of a shielding case according to a fourth variant example.

A shielding case of the fourth variant is shown in FIG. 19, which is a rear elevation.

As shown in FIG. 19, the back plate 56 of the shielding case 22 of this variant is provided with a circular opening 106 formed in such a manner as to expose the side surface of the output connector 34 soldered on the printed circuit board 24. As a result, it becomes possible to look at the side surface of the output connector 34 by looking from the backside of the rear plate 56 of the shielding case 22, when the assembling work is to be carried out. Consequently, it becomes easier to carry out the insertion/connection operation of a terminal of a cable or the like (not shown in the figures) by checking the relationship between the positions of the terminal of a cable or the like (not shown in the figures) and the output connector 34.

Figure 20A:
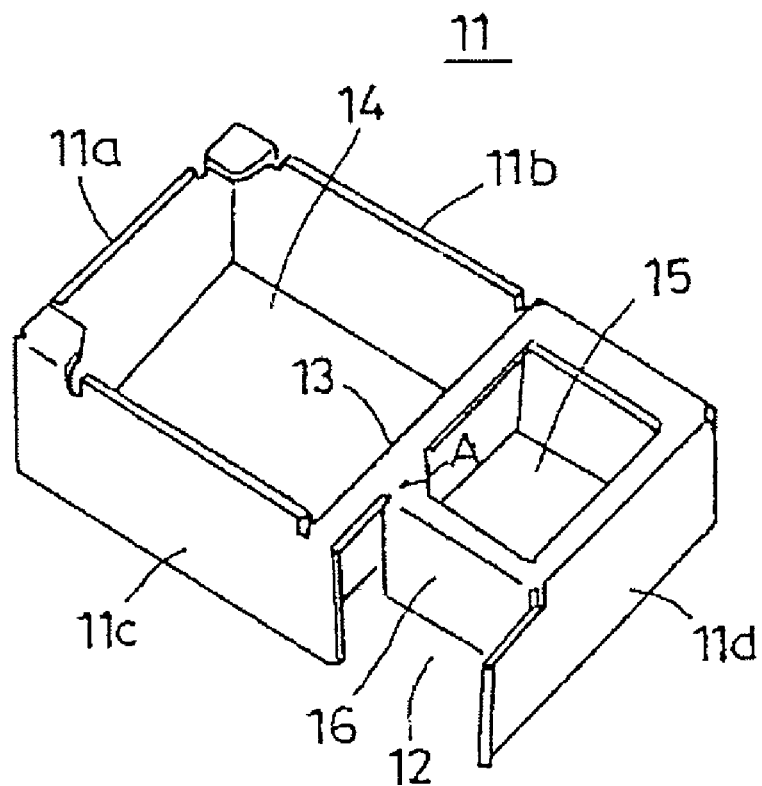
FIG. 20A and FIG. 20B show a housing that is different from the housing 42, seen from various directions, i.e., a perspective view and a side elevation, respectively.
Figure 20B:
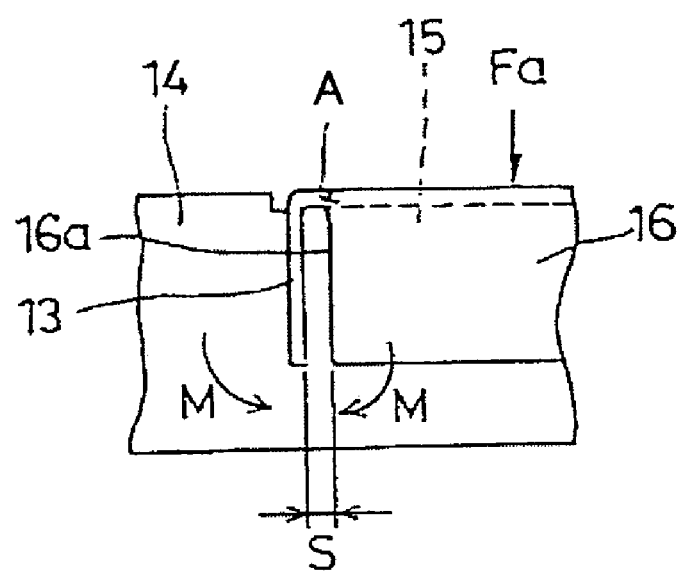
Figure 21A:
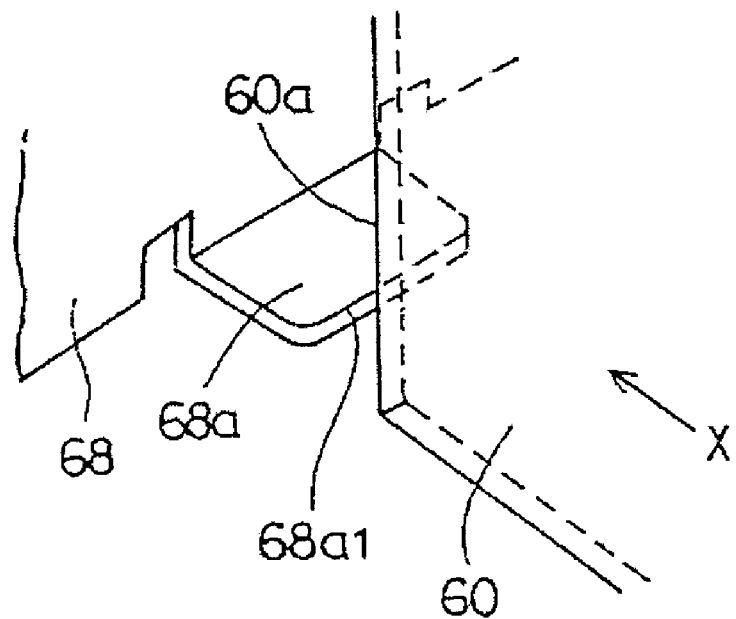
FIG. 21A and FIG. 21B show further details of the housing 42 of the embodiment, respectively, where a jutting portion 68*a* of a partition wall 68 of the housing 42 is abutting on a side plate 60 of a recessed portion.
Figure 21B:
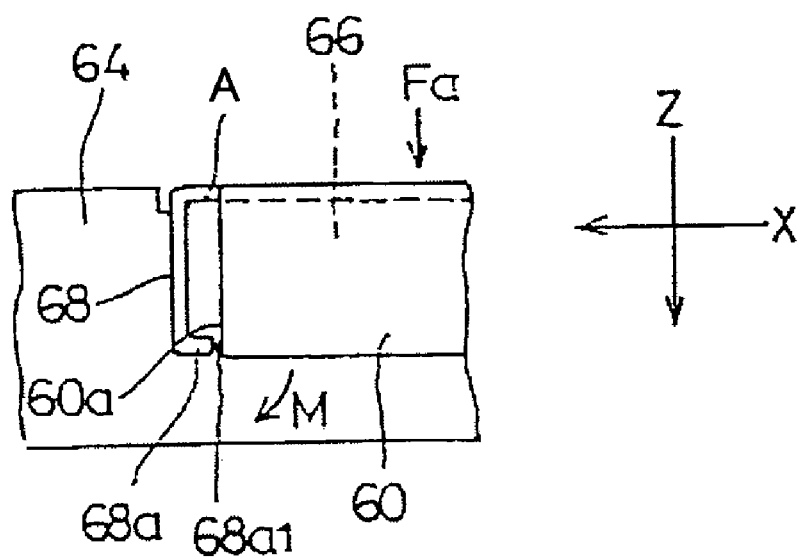

Turning to more details of the above embodiment, FIG. 21A and FIG. 21B show the housing 42 in detail. More specifically, FIG. 21A and FIG. 21B show the recession-side plate 60 being abutted on the jutting portion 68a of the partition wall 68 of the housing 42, in a perspective view and in a side elevation, respectively. In comparison, FIG. 20A and FIG. 20B show a housing that is different from the housing 42 and are described later.

As shown in FIG. 21A and FIG. 21B; the end portion 60a of the recession-side plate 60 is abutted on the tip 68a1 of the horizontal jutting portion 68a cut and bent up from the lower end of the partition wall 68. Therefore, the relative movement in the "X" direction is controlled. As a result, for example, when a pressing force "Fa" from above is exerted on the top surface of the recession-side plate 60, the end portion 60a abuts on the tip 68a1 of the horizontal jutting portion 68a of the the partition wall 68, thereby preventing deformations by the force "Fa" due to, for example, vibrations during transportation. Therefore, it becomes unnecessary to perform the difficult repairing work on deformations of the recession-side plate 60 when the soldering work is going to be performed on the printed circuit board 24. Consequently, the operational efficiency of the assembly process is increased.

As for the cost of the housing 42 of the above embodiment, with such cut-and-bent-up lower end portion of the partition wall 68, the deformations of the recession-side plate 60 prior to the soldering process of the printed circuit board 24 are effectively prevented. Therefore, the cost required for prevention of the deformations can be controlled to a relatively small level.

Now, in conjunction with the above described details of the embodiment shown in FIG. 21, variants that may be employed in the present invention are illustratively described below.

Figure 22:
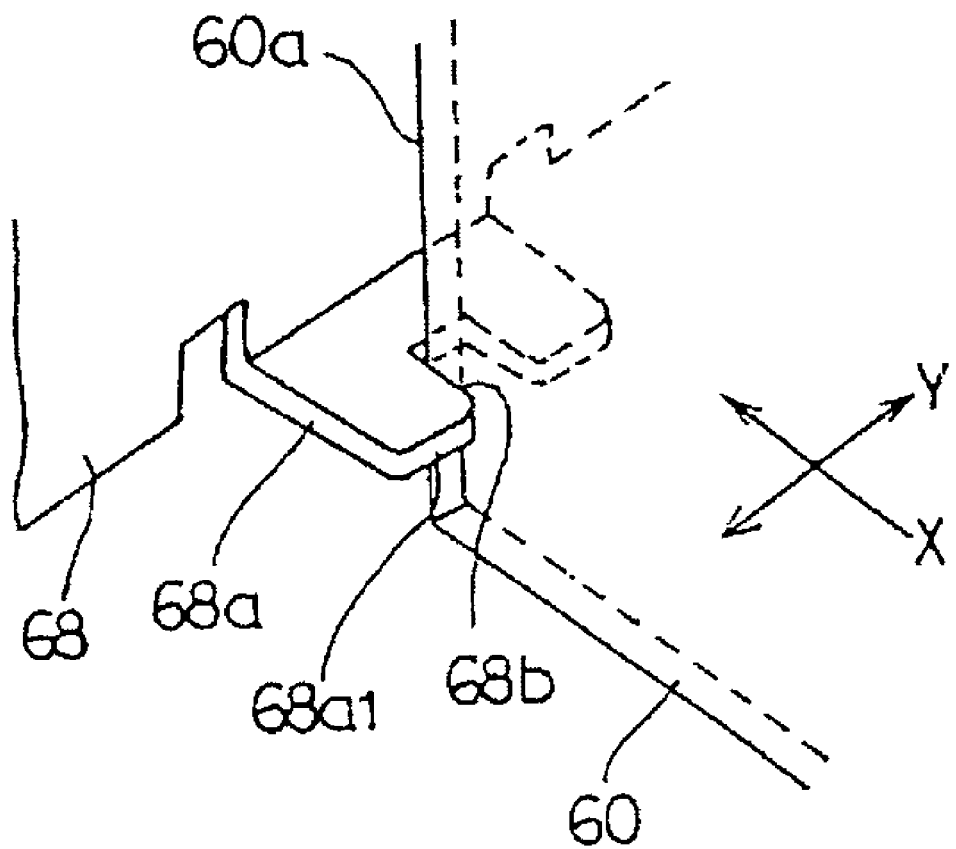
FIG. 22 is a detailed perspective view of a housing as a variant of the housing 44.

FIG. 22 is a detailed perspective view of a variant of the housing 44.

In this variant, as shown in FIG. 22, a groove 68b is formed at the tip 68a1 of the jutting portion 68a of the partition wall 68. The groove 68b extends in the "X" direction and has an opened end at the tip 68a1 of the jutting portion 68a of the partition wall 68. The end portion 60a of the recession-side plate 60 is fitted in the groove 68b. Therefore, its displacement is controlled both in the "X" and "Y" directions, which are perpendicular to each other.

As a result, the deformations of the recession-side plate 60 due to pressing forces in the "X" and "Y" directions are prevented. Therefore, when a force in the "X" or "Y" direction due to vibrations during transportation, for example, is exerted on the recession-side plate 60, the deformations in the "X" and "Y" are prevented. Therefore, it becomes unnecessary to perform the difficult repairing work on deformations of the recession-side plate 60 when the soldering work is going to be performed on the printed circuit board 24. Consequently, the operational efficiency of the assembly process is increased.

With this variant, with such cut-and-bent-up lower end portion of the partition wall 68, the deformations of the recession-side plate 60 prior to the soldering process of the printed circuit board 24 are effectively prevented. Therefore, the cost required for prevention of the deformations of the housing 42 can be controlled to a relatively small level.

From one point of view, a feature of these structures just described in detail with respect to the embodiment and the variant can be understood as a shielding case that houses a circuit board on which an electronic component and a connector are mounted, said shielding case comprising a partition wall, a recessed portion and a jutting portion, wherein the partition wall divides the internal space of the shielding case into a first compartment and a second compartment, wherein the recessed portion is defined by locating a side plate of the second compartment at an inner position compared to a side plate of the first compartment, wherein the recessed portion is provided with an opening located in a lateral direction from the mounting position of the connector, wherein the recessed portion is provided with an opening located in an upward direction from the mounting position of the connector, wherein the jutting portion juts from the partition wall to the position where it abuts on the end portion of the side plate of the second compartment.

It should be noted that such a feature considered alone can produce an advantageous effects, i.e., when a load is exerted on the partition wall of the shielding case prior to the soldering work performed on the printed circuit board, the jutting portion of the partition wall abuts on the end portion of the side plate of the second compartment, thereby preventing deformations of the side plate of the second compartment. Further, by cutting and bending up a portion of the lower end of the partition wall, the side plate of the second compartment is kept from being deformed prior to the soldering work performed on the printed circuit board. Therefore, it becomes unnecessary to perform the difficult repairing work on deformations of the side plate of the second compartment when the soldering work is going to be performed on the printed circuit board 24. Consequently, the operational efficiency of the assembly process can be increased.

In contrast, a shielding case housing 11 that is different from the above described housing 42 is shown in FIG. 20A and FIG. 20B. The shielding case housing 11 has a box-type structure made up of a front plate 11a, a right plate 11c, a left plate 11b and a rear plate 11d that are formed by pressing flat sheet metal. A printed circuit board (not shown in the figures) with mounted electronic components and connectors is housed within the shielding case housing 11. Further, the internal space of the shielding case housing 11 is divided into a first compartment 14 and a second compartment 15 by a partition wall 13. Thus, electronic components on the circuit board are also divided into the first compartment 14 and the second compartment 15.

A side plate 16 of the second compartment 15 is bent downward at an inner position than the left side plate 11c of the first compartment, thereby defining a recessed portion 12 with its side and top opened. Illustratively, the recessed portion 12 is formed based on the aforementioned mounting position of the output connector. Therefore, it becomes possible to insert a cable sideways or from above relative to the output connector on the circuit board.

When the pressing process is finished, the shielding case housing 11 is fed to an assembly line and is soldered to a printed circuit board, where the rigidity is increased.

However, as stated above, with the structure having the recessed portion 12 formed at the side surface of the second compartment 15, usually there is a clearance "S" that separates the partition wall 13 and the end portion of the side plate 16 that extends in a direction perpendicular to the partition wall 13, as shown in FIG. 20B.

Therefore, during the manufacturing processes before soldering the shielding case housing 11 with the printed circuit board, the shielding case housing 11 is conveyed in the state shown in FIG. 20A, and, since there is the clearance "S" between the partition wall 13 and the end portion of the side plate 16, it can happen that the end portion 16a of the side plate 16 is deformed and comes closer to the partition wall 13, when a load "Fa" is exerted on the top surface of the side plate 16 and effects a bending moment to the side plate 16 with the shown point "A" as the fulcrum. It is especially possible that the load "Fa" takes place due to vibrations, etc., during transportation, and, when that happens, the side plate becomes inclined relative to the printed circuit board, which necessitates the repairing work on the deformed side plates 16, thereby degrading the operational efficiency of the assembly process.

Now, in view of the above descriptions, it will be appreciated by one of ordinary skill in the art, that these problems are solved by the aforementioned feature of the variant and the corresponding details of the embodiment. According to the present invention, the aforementioned feature taken alone can prevent the deformation of a side plate that defines a mounting position of a connector of a shielding case.

Next, the aforementioned first locking mechanism 110 and the second locking mechanism 120 are described in detail.

Figure 23:
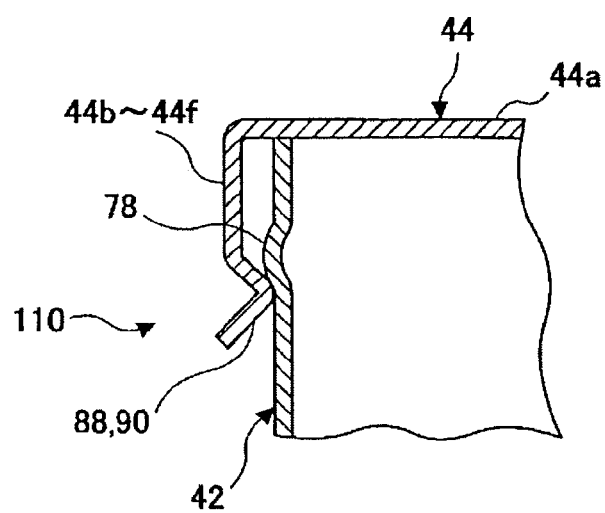
FIG. 23 is a section view of a first locking mechanism 110 of the present invention.

FIG. 23 shows the first locking mechanism 110 of the present invention in a sectional view.

As shown in FIG. 23 and FIGS. 8A through 8B, when the upper cover 44 is mounted on the upper portion of the housing 44, the upper protrusions 76 of the housing 42 are engaged by distal portions 88 and 90 of the front catching portions 44b, the left catching portions 44c, the right catching portions 44d, the second right catching portions 44e and the rear catching portions 44f that are located at respective sides in four directions of the upper cover 44. As a result, the upper opening of the housing 42 is kept in a closed state.

The first locking mechanism 110 about the upper cover 44 of the embodiment is made up of the upper protrusions 76 of the housing 42, the front catching portions 44b, the left catching portions 44c, the right catching portions 44d, the second right catching portions 44e and the rear catching portions 44f of the upper cover 44.

The first locking mechanism 110 has a structure where the distal portions 88 and 90 bent in the shape of an elbow catch the upper protrusions 76 that protrude in the shape of a semicircle. When an upward force is exerted at the upper cover 44, the distal portions 88 and 90 move to the outside through elastic deformation in such a manner that the locked state is unlocked.

The first locking mechanism 110 about the lower cover 46 of the embodiment, i.e., the locking mechanism that locks the lower cover 46 under the housing 42 has the structure where the lower protrusions 78 of the housing 42 are engaged by distal portions 96 and 97 of the front catching portions 46b, the left catching portions 46c, the right catching portions 46d and the rear catching portions 46e of the lower cover 46, as shown in FIGS. 13A through 13B, which is quite similar to the structure of the first locking mechanism 110 about the upper cover 44. Therefore, its further details are omitted.

Figure 24:
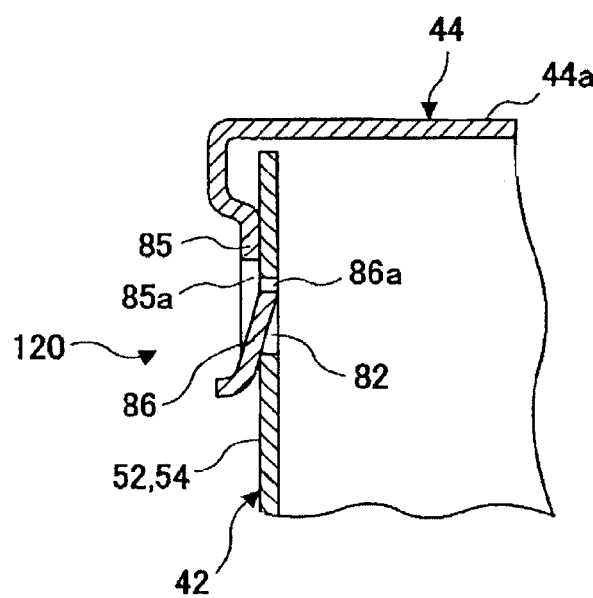
FIG. 24 is a section view of a second locking mechanism 120 of the present invention.

FIG. 24 shows one of a pair of second locking mechanisms 120 in a section view.

As shown in FIG. 2D, FIG. 24 and FIGS. 9A through 10B, the right one of the second locking mechanisms 120 of this embodiment has the upper locking hole 80 of the housing 42 and the locking member 86 of the locking portion 85 located at the center of the right side surface of the upper cover 44. The other second locking mechanism 120, i.e., the left one (shown in FIG. 2E) has another upper locking hole 80 of the housing 42 and another locking member 86 of another locking portion 85 located at the center of the left side surface of the upper cover 44.

With these second locking mechanisms 120, when the upper cover 44 is mounted on the upper portion of the housing 42, the upper end portions 86a of the locking members 86 are fitted in the upper locking holes 80 of the housing 42. The lower ends of the locking members 86 are united with the locking portions 85. Since the upper end portions 86a are inclined to the inside, the locking is effected by moving the upper end portions 86a into the upper locking holes 80.

The second locking mechanisms 120, provided one at the right side and one at the left side of the shielding case 22 firmly lock the right and left surfaces of the upper cover 44 through the engagement of the locking members 86 and the upper locking holes 80. As a result, when an external impulsive force is exerted on the shielding case 22, the upper end portions 86a of the locking members 86 abuts on the upper locking hole 80, which reliably prevents the disengagement of the upper cover 44.

Furthermore, there are second locking mechanisms that lock the lower cover 46 under the housing 42. One of these second locking mechanisms for the lower cover 46 is shown in FIGS. 14A, 14B, 15A and 15B. It is made up of the locking member 95 of the locking portion 94 located at the center of the right (or left) side surface of the lower cover 46 and the lower locking hole 82 of the housing 42. The structures of the second locking mechanisms for the lower cover 46 are basically the same as the second locking mechanisms for the upper cover 44. Therefore, their further details are omitted.

In this manner, the upper cover 44 and the lower cover 46 of the shielding case 22 are reliably locked at the housing 42 by means of the first locking mechanisms 110 and the second locking mechanisms 120, thereby preventing the upper cover 44 and the lower cover 46 from being disengaged. The second locking mechanisms 120 can be unlocked by moving the locking members 86 and 95 away from the left and right side surfaces of the housing 42.

Figure 25A:
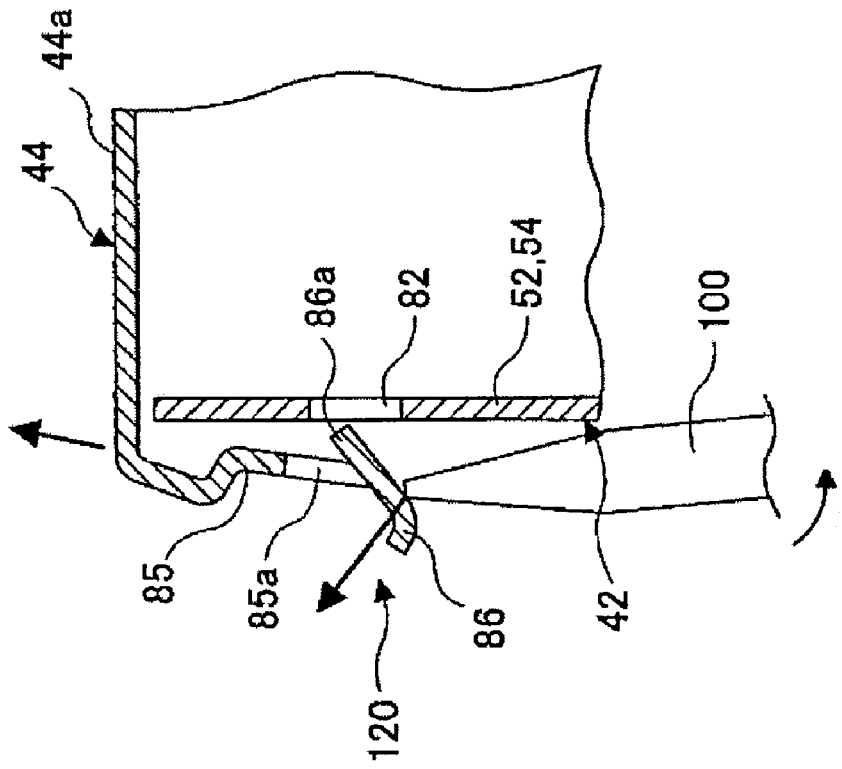
FIG. 25A and FIG. 25B show a state when an unlocking operation is started and a state when the unlocking operation is finished, respectively in section views of the second locking mechanism 120.
Figure 25B:
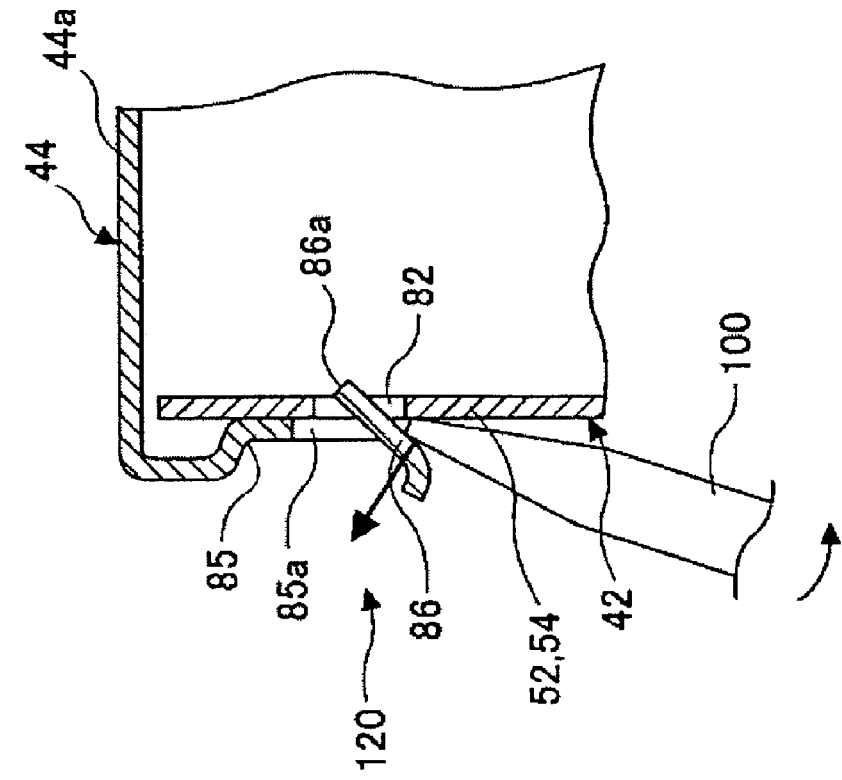

Now, to further describe the unlocking operation of the second locking mechanisms 120, FIG. 25A shows a state when an unlocking operation of one of the second locking mechanisms 120 is started and FIG. 25B shows a state when the unlocking operation is finished As shown in FIG. 25A, when one of the second locking mechanisms 120 is to be unlocked, a tip of a pointed tool 100, for example, a minus screw driver (flat-blade screwdriver) is inserted between the housing 42 and the inside surface of the locking member 86.

Then, the minus screw driver 100 is operated in such a manner that the tip moves in the direction shown by a straight arrow in FIG. 25A. In doing so, the minus driver 100 is pressed in the opposite direction of the traveling direction of the tip, thereby applying a principle of leverage. As a result, the tip of the minus screw driver 100 travels with the locking member 86 in a direction that goes away from the housing 42.

As shown in FIG. 25B, by using the minus screw driver 100, it becomes easier to move the locking member 86 in the unlocking direction. When the upper end portion 86a is pulled out of the upper locking hole 80, the upper cover 44 is pulled upward, which makes the distal portions 88 and 90 of the front catching portions 44b, the left catching portions 44c, the right catching portions 44d, the second right catching portions 44e and the rear catching portions 44f of the upper cover 44 go over the upper protrusions 76 of the housing 42. As a result, the first locking mechanisms are unlocked.

The unlocking operation of the lower cover 46 is. basically the same as the upper cover 44. Therefore, their further details are omitted.

From one point of view, a feature of these structures just described in detail with respect to the embodiment can be understood as a shielding case that houses a circuit board on which an electronic component and a connector are mounted, said shielding case comprising a housing, a cover, a first locking mechanism and a second locking mechanism, wherein the housing houses the circuit board, wherein the cover covers an opening of the housing, wherein the first locking mechanism comprises a plurality of catching portions located at a side surface of the cover and a protrusion on a side surface of the housing in such a manner that the catching portions can catch the protrusion, wherein the second locking mechanism comprises a locking claw located at the side surface of the cover and a locking hole located at the side surface of the housing in such a manner that the locking claw can be engaged in the locking hole.

It should be noted that such a feature considered alone can produce the abovementioned advantageous effect, i.e., the cover can be firmly locked at the housing and therefore the cover is kept from being disengaged when an external impulsive force is exerted.

Further, when the second locking mechanism is located at the center of at least one side of the side surfaces of the housing and the cover in four directions, it becomes possible to lock the cover at the housing firmly at fewer positions, thereby reducing manufacturing cost and still being capable of preventing disengagements of the cover due to external impulsive forces.

Alternatively, when the second locking mechanism is located at at least one pair of side surfaces that face each other among the side surfaces of the housing and the cover in four directions, it becomes possible to lock the cover at the housing firmly at fewer positions, thereby reducing manufacturing cost and still being capable of preventing disengagements of the cover due to external impulsive forces.

The present invention is not limited to the specifically disclosed embodiments, and variations and modifications may be made without departing from the scope of the present invention.

This application claims priority rights of and is based on Japanese patent applications Nos. JPAP2002-1192, JPAP2002-1193, JPAP2002-1195 and JPAP2002-1196 filed on Jan. 8, 2002 in the Japanese Patent Office, the entire contents of which are hereby incorporated by reference.

What is claimed is:

1. A shielding case that houses a circuit board on which an electronic component and a connector are mounted, said shielding case defining a recessed portion by its case wall, wherein said recessed portion is provided with an opening located in a lateral direction from the mounting position of said connector, wherein said recessed portion is provided with an opening located in a vertical direction from said mounting position of said connector, wherein said shielding case has a shape adapted for standing said shielding case in a vertical direction, wherein said shape is also adapted for laying said shielding case in a horizontal direction.

2. The shield case as claimed in claim 1, wherein, an aperture is provided at a position facing a side surface of said connector itself allowing the connector to be viewed externally whether the shield case is placed in a vertical direction or the shield case is placed in a horizontal direction.

3. A shielding case adapted to house a circuit board on which an electronic component and a connector are mounted, said shielding case defining a recessed portion by its case wall, wherein the outline of said shielding case is generally a rectangular parallelepiped, wherein said recessed portion defines a space that has an opening that extends from a first side surface of said rectangular parallelepiped to a second side surface of said rectangular parallelepiped across the border of said first and second side surfaces, wherein said second side surface is perpendicular to said first side surface, wherein said opening has an shape that allows said connector to be mounted within said space though said opening, wherein said shielding case has a shape adapted for standing said shielding case in a vertical direction, wherein said shape is also adapted for laying said shielding case in a horizontal direction.

4. The shielding case as claimed in claim 3, wherein said space is located at one of the eight corners of said rectangular parallelepiped, wherein said space is spaced apart from the other seven of the eight corners of said rectangular parallelepiped.

5. The shielding case as claimed in claim 4, wherein said space is spaced apart from at least one of said seven other corners, by means of said circuit board.

6. The shield case as claimed in claim 3, wherein, an aperture is provided at a position facing a side surface of said connector itself allowing the connector to be viewed externally whether the shield case is placed in a vertical direction or the shield case is placed in a horizontal direction.

7. A shielding case adapted to house a circuit board on which an electronic component and a connector are mounted, said shielding case defining a recessed portion by its case wall, wherein said shielding case comprises a housing body, a first housing cover, a second housing cover, each made of shielding material, wherein said circuit board has a generally planar shape defined by a first surface and a second surface, wherein said second surface face is the reverse surface of said first surface, wherein the mounting position of said electronic component and the mounting position of said connector are both on said first surface, wherein said housing body comprises housing walls that surround the mounting position of said electronic component along said first surface, wherein said housing walls extend away from said first surface in a perpendicular direction with respect to said first surface, wherein said housing walls define a housing opening that faces said circuit board and the mounting position of said electronic component, wherein said first housing cover faces said housing opening and the mounting position of said electronic component, when said first housing cover is mounted at a predetermined location of said housing body, wherein said second surface of said circuit board is completely faced by said second housing cover, when said second housing cover is mounted at a location that is closer to said circuit board than said predetermined location, wherein said recessed portion is substantially defined by said housing body and said second housing cover, wherein the mounting position is within said recessed portion, wherein said shielding case is open to the outside in a direction, as seen from the mounting position of said connector, perpendicularly away from said circuit board, wherein said shielding case is open to the outside in a direction, as seen from the mounting position of said connector, perpendicularly away from said the housing body, wherein said shielding case has a shape adapted for standing said shielding case in a vertical direction, wherein said shape is also adapted for laying said shielding case in a horizontal direction.

8. A shielding case that houses a circuit board on which an electronic component and a connector are mounted, said shielding case defining a recessed portion by its case wall, wherein said recessed portion is open to the outside in a lateral direction from the mounting position of said connector, wherein said recessed portion is open to the outside in a vertical direction from said mounting position of said connector, wherein said shielding case further comprises an aperture in its case wall, wherein said aperture faces a side surface of said connector mounted on the circuit board, wherein said shielding case has a shape adapted for standing said shielding case in a vertical direction, wherein said shape is also adapted for laying said shielding case in a horizontal direction.

9. The shield case as claimed in claim 8, wherein, an aperture is provided at a position facing a side surface of said connector itself allowing the connector to be viewed externally whether the shield case is placed in a vertical direction or the shield case is placed in a horizontal direction.

* * * * *